(12) United States Patent
Nishimura et al.

(10) Patent No.: US 10,228,620 B2
(45) Date of Patent: Mar. 12, 2019

(54) TRIAZINE-RING-CONTAINING POLYMER AND COMPOSITION CONTAINING SAME

(71) Applicant: NISSAN CHEMICAL INDUSTRIES, LTD., Tokyo (JP)

(72) Inventors: Naoya Nishimura, Funabashi (JP); Takahiro Kaseyama, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/543,898

(22) PCT Filed: Jan. 14, 2016

(86) PCT No.: PCT/JP2016/050930
§ 371 (c)(1),
(2) Date: Jul. 14, 2017

(87) PCT Pub. No.: WO2016/114337
PCT Pub. Date: Jul. 21, 2016

(65) Prior Publication Data
US 2017/0362382 A1    Dec. 21, 2017

(30) Foreign Application Priority Data

Jan. 15, 2015  (JP) ................... 2015-005919

(51) Int. Cl.
*G03F 7/038* (2006.01)
*G03F 7/004* (2006.01)
(Continued)

(52) U.S. Cl.
CPC ......... *G03F 7/038* (2013.01); *C08G 73/0644* (2013.01); *C08J 3/24* (2013.01);
(Continued)

(58) Field of Classification Search
CPC ......... G03F 7/004; G03F 7/038; C08G 73/00; C08G 73/02; C08G 73/0644
(Continued)

(56) References Cited

U.S. PATENT DOCUMENTS 8,618,243 B2 * 12/2013 Nishimura ......... C08G 73/0273
257/432
9,618,654 B2 * 4/2017 Nishimura .......... H01L 51/5268
(Continued)

FOREIGN PATENT DOCUMENTS

DE    19644930 A1 * 3/1998 ......... C08G 65/4006
JP    07113009 A  * 5/1995 ............. C08G 73/02
(Continued)

OTHER PUBLICATIONS

Machine translation of JP 2012-092261 (no date).*
(Continued)

*Primary Examiner* — Amanda C. Walke
(74) *Attorney, Agent, or Firm* — Birch, Stewart, Kolasch & Birch, LLP

(57) ABSTRACT

For example, a thin film which has a high refractive index and which it is possible to form a fine pattern can be obtained by using a composition that contains a triazine-ring-containing polymer that includes a repeating unit structure represented by formula [5].

(Continued)

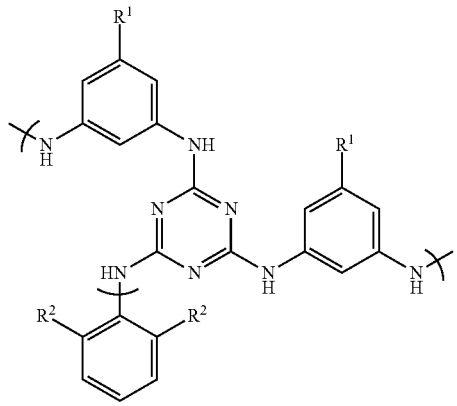

R[1]: H or COOH
R[2]: H or Me

15 Claims, 1 Drawing Sheet

(51) Int. Cl.
| | |
|---|---|
| *C08K 5/101* | (2006.01) |
| *C09D 179/04* | (2006.01) |
| *C08L 79/04* | (2006.01) |
| *G03F 7/032* | (2006.01) |
| *C08G 73/06* | (2006.01) |
| *C08J 3/24* | (2006.01) |
| *C08J 5/18* | (2006.01) |

(52) U.S. Cl.
CPC ................ *C08J 5/18* (2013.01); *C08K 5/101* (2013.01); *C08L 79/04* (2013.01); *C09D 179/04* (2013.01); *G03F 7/004* (2013.01); *G03F 7/032* (2013.01); *C08J 2379/04* (2013.01)

(58) Field of Classification Search
USPC ...................................................... 430/270.1
See application file for complete search history.

(56) References Cited

U.S. PATENT DOCUMENTS

| | | |
|---|---|---|
| 2012/0049308 A1 | 3/2012 | Nishimura et al. |
| 2015/0115247 A1 | 4/2015 | Nishimura et al. |

FOREIGN PATENT DOCUMENTS

| | | |
|---|---|---|
| JP | 2004-156001 A | 6/2004 |
| JP | 2012-092261 A | 5/2012 |
| WO | WO 2010/128661 A1 | 11/2010 |
| WO | WO 2013/168788 A1 | 11/2013 |
| WO | WO 2016/024613 A1 | 2/2016 |

OTHER PUBLICATIONS

Machine translation of JP 2004-156001 (no date).*
International Search Report for PCT/JP2016/050930 (PCT/ISA/210) dated Apr. 5, 2016.
Written Opinion of the International Searching Authority for PCT/JP2016/050930 (PCT/ISA/237) dated Apr. 5, 2016.

* cited by examiner

TRIAZINE-RING-CONTAINING POLYMER AND COMPOSITION CONTAINING SAME

TECHNICAL FIELD

The present invention relates to a triazine ring-containing polymer and a composition that includes the same.

BACKGROUND ART

In recent years, a need has arisen for high-performance polymeric materials in the development of electronic devices such as liquid-crystal displays, organic electroluminescent (EL) displays, touch panels, optical semiconductor (LED) devices, solid-state image sensors, organic thin-film solar cells, dye-sensitized solar cells and organic thin-film transistors (TFT).

The specific properties desired of such materials include: (1) heat resistance, (2) transparency, (3) high refractive index, (4) high solubility, (5) low volume shrinkage, (6) high moisture resistance at high temperatures, and (7) high film hardness.

The inventors earlier discovered that polymers containing recurring units which have a triazine ring and an aromatic ring possess a high refractive index and are able, with the polymer alone, to achieve a high heat resistance, high transparency, high refractive index, high solubility and low volume shrinkage, thus making such polymers suitable as film-forming compositions in the fabrication of electronic devices (Patent Document 1).

Of related interest, pattern formation using transparent materials is carried out in spacers, insulating films, protective films and the like for liquid-crystal display elements. Many negative-working photosensitive compositions have hitherto been described for such applications.

In particular, recently, with the increased demand for high-definition liquid-crystal displays and cell phone displays, there has arisen a desire for small patterns 10 μm or less in diameter.

Also, in touch panels, to enhance the visibility of the transparent electrode, there is an increased need for a high refractive index layer. However, the presence of an insulating film in electrode wiring areas affects responsiveness, and so it is necessary to remove the insulating layer over a width of 100 to 1,000 μm from the wiring areas.

Existing materials used in this application are inadequate in terms of refractive index. Moreover, it is difficult to increase the refractive index above 1.7 while maintaining the transparency.

Although the polymer of Patent Document 1 is able to address such needs in terms of the refractive index, there remains room for improvement with regard to fine pattern formability.

Patent Document 2 discloses a pattern-forming composition that includes a triazine ring-containing polymer, but this polymer has a refractive index of less than 1.7 and is thus unsuitable for the above applications requiring a higher index of refraction.

PRIOR ART DOCUMENTS

Patent Documents

Patent Document 1: WO 2010/128661
Patent Document 2: JP-A 2004-156001

SUMMARY OF THE INVENTION

Problems to be Solved by the Invention

It is therefore an object of the invention to provide a triazine ring-containing polymer which can form a thin film having a high refractive index and excellent transparency and which is also capable of forming a fine pattern having a high refractive index. Another object is to provide a composition containing such a polymer.

Means for Solving the Problems

The inventors have conducted extensive investigations in order to achieve these objects. As a result, they have discovered that, by using a triazine ring-containing polymer having carboxyl groups on aryl groups making up the main chain, thin films having a high refractive index and excellent transparency can be formed and fine patterns having a high refractive index can also be formed.

Accordingly, the invention provides:

1. A triazine ring-containing polymer which includes a recurring unit structure of formula (1) below

[Chemical Formula 1]

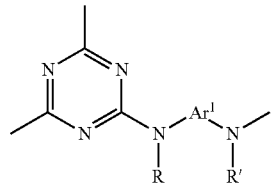

(1)

wherein R and R' are each independently a hydrogen atom, an alkyl group, an alkoxy group, an aryl group or an aralkyl group; and $Ar^1$ is at least one moiety selected from the group consisting of moieties of formulas (2) to (13)

[Chemical Formula 2]

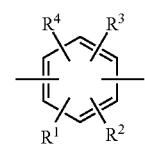

(2)

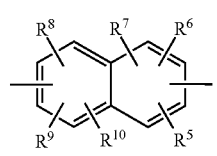

(3)

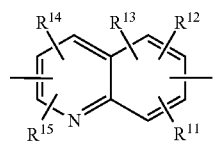

(4)

-continued

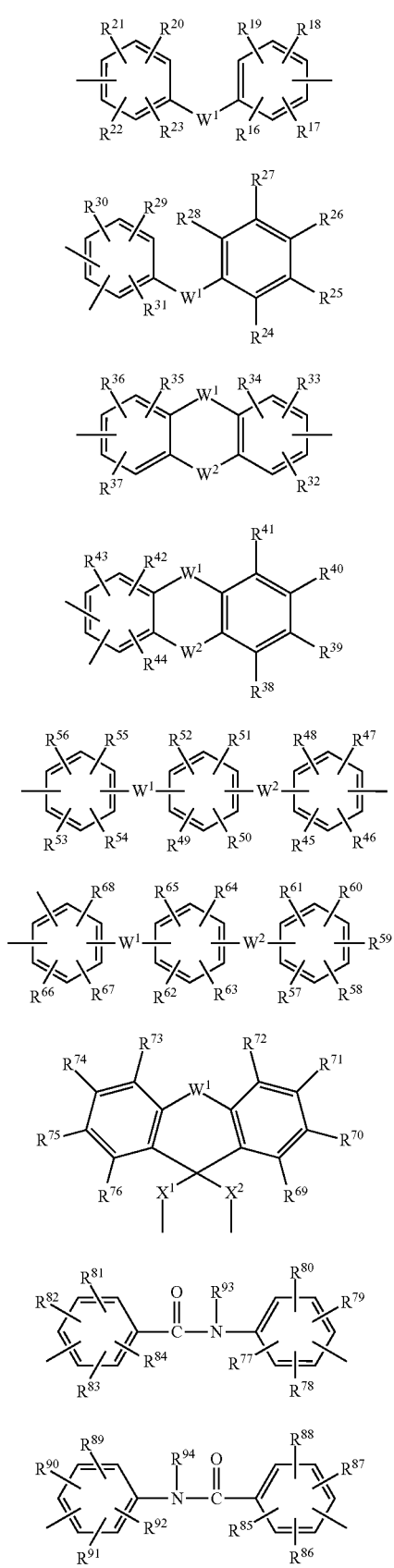

(5)
(6)
(7)
(8)
(9)
(10)
(11)
(12)
(13)

[wherein $R^1$ to $R^{92}$ are each independently a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure; $R^{93}$ and $R^{94}$ are each a hydrogen atom or an alkyl group of 1 to 10 carbon atoms which may have a branched structure; $W^1$ and $W^2$ are each independently a single bond, $CR^{95}R^{96}$ (wherein $R^{95}$ and $R^{96}$ are each independently a hydrogen atom or an alkyl group of 1 to 10 carbon atoms which may have a branched structure, and $R^{95}$ and $R^{96}$ may together form a ring), C=O, O, S, SO, $SO_2$ or $NR^{97}$ ($R^{97}$ being a hydrogen atom or an alkyl group of 1 to 10 carbon atoms which may have a branched structure); and $X^1$ and $X^2$ are each independently a single bond, an alkylene group of 1 to 10 carbon atoms which may have a branched structure, or a group of formula (14)

[Chemical Formula 3]

(14)

(wherein $R^{98}$ to $R^{101}$ are each independently a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure; and $Y^1$ and $Y^2$ are each independently a single bond or an alkylene group of 1 to 10 carbon atoms which may have a branched structure);

with the proviso that formulas (2) to (13) all have at least one carboxyl group on one aromatic ring therein];

2. The triazine ring-containing polymer of 1 above which further includes a recurring unit structure of formula (1') below

[Chemical Formula 4]

(1')

(wherein R and R' are each independently a hydrogen atom, an alkyl group, an alkoxy group, an aryl group or an aralkyl group; and $Ar^2$ is at least one moiety selected from the group consisting of moieties of formulas (2') to (13')

[Chemical Formula 5]

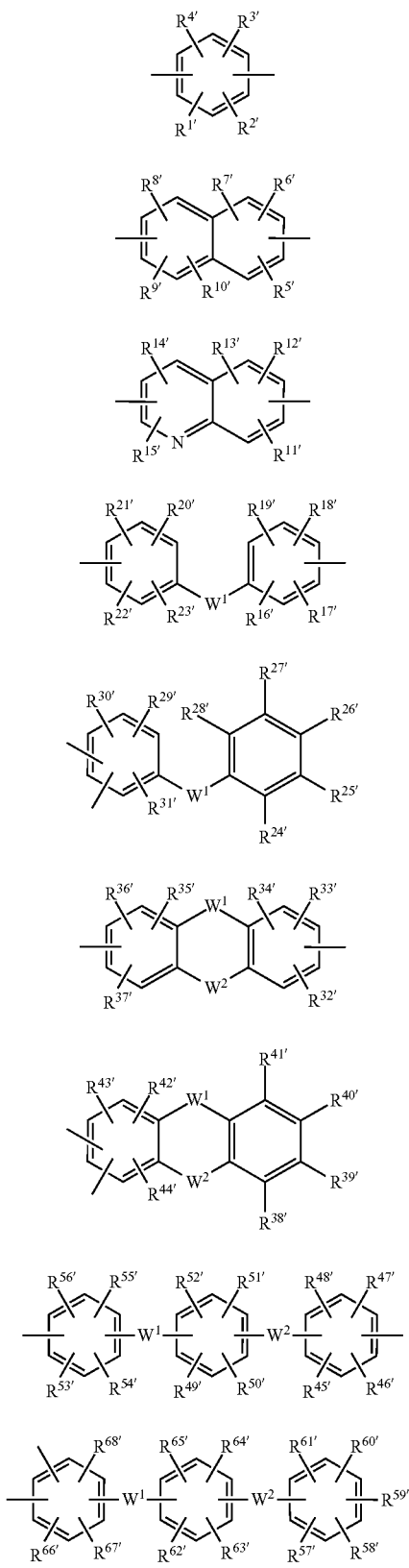

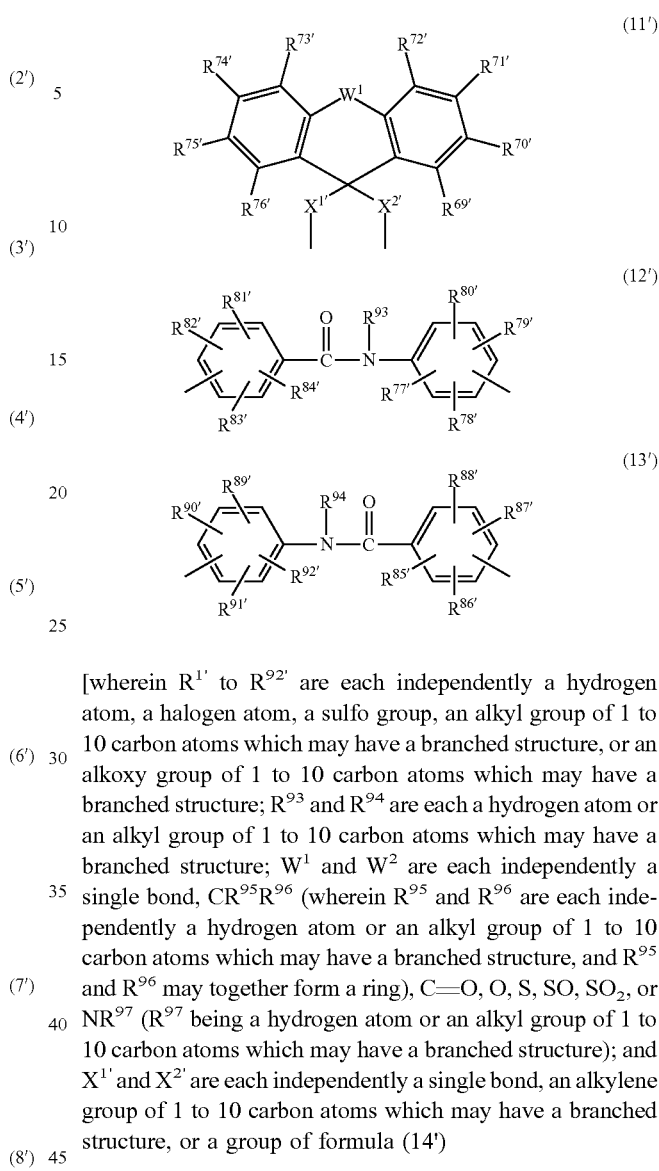

[wherein $R^{1'}$ to $R^{92'}$ are each independently a hydrogen atom, a halogen atom, a sulfo group, an alkyl group of 1 to 10 carbon atoms which may have a branched structure, or an alkoxy group of 1 to 10 carbon atoms which may have a branched structure; $R^{93}$ and $R^{94}$ are each a hydrogen atom or an alkyl group of 1 to 10 carbon atoms which may have a branched structure; $W^1$ and $W^2$ are each independently a single bond, $CR^{95}R^{96}$ (wherein $R^{95}$ and $R^{96}$ are each independently a hydrogen atom or an alkyl group of 1 to 10 carbon atoms which may have a branched structure, and $R^{95}$ and $R^{96}$ may together form a ring), C=O, O, S, SO, $SO_2$, or $NR^{97}$ ($R^{97}$ being a hydrogen atom or an alkyl group of 1 to 10 carbon atoms which may have a branched structure); and $X^{1'}$ and $X^{2'}$ are each independently a single bond, an alkylene group of 1 to 10 carbon atoms which may have a branched structure, or a group of formula (14')

[Chemical Formula 6]

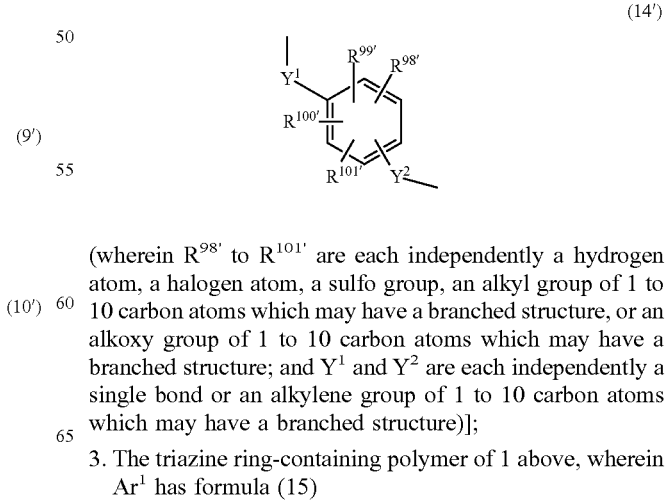

(wherein $R^{98'}$ to $R^{101'}$ are each independently a hydrogen atom, a halogen atom, a sulfo group, an alkyl group of 1 to 10 carbon atoms which may have a branched structure, or an alkoxy group of 1 to 10 carbon atoms which may have a branched structure; and $Y^1$ and $Y^2$ are each independently a single bond or an alkylene group of 1 to 10 carbon atoms which may have a branched structure)];

3. The triazine ring-containing polymer of 1 above, wherein $Ar^1$ has formula (15)

[Chemical Formula 7]

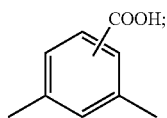

(15)

4. The triazine ring-containing polymer of 3 above, wherein $Ar^1$ has formula (16)

[Chemical Formula 8]

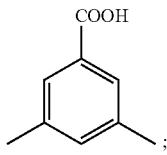

(16)

5. The triazine ring-containing polymer of 2 above, wherein $Ar^2$ has formula (17)

[Chemical Formula 9]

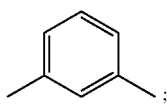

(17)

6. The triazine ring-containing polymer of any of 1 to 5 above, wherein the polymer has at least one triazine ring end, and at least a portion of the triazine ring ends are capped with an arylamino group that may be substituted with an alkyl, alkoxy, aryl or aralkyl group;
7. The triazine ring-containing polymer of 6 above, wherein the arylamino group has the alkyl, alkoxy, aryl or aralkyl group at at least one ortho position to the amino group thereon;
8. The triazine ring-containing polymer of 7 above, wherein the arylamino group has the alkyl, alkoxy, aryl or aralkyl group at both ortho positions to the amino group thereon;
9. The triazine ring-containing polymer of 8 above, wherein the arylamino group has formula (18)

[Chemical Formula 10]

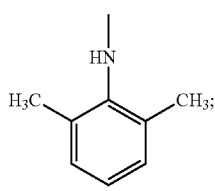

(18)

10. A triazine polymer-containing composition comprising the triazine ring-containing polymer of any of 1 to 9 above and an organic solvent;
11. The triazine polymer-containing composition of 10 above which further comprises a crosslinking agent;
12. The triazine polymer-containing composition of 11 above, wherein the crosslinking agent is a poly(meth)acrylic compound;
13. The triazine polymer-containing composition of 11 or 12 above for use in forming a cured film or in patterning;
14. A cured film obtained by curing the triazine polymer-containing composition of any of 11 to 13 above;
15. A pattern produced from the triazine polymer-containing composition of 11 or 12 above;
16. An electronic device comprising a substrate and the cured film of 14 above formed on the substrate;
17. An optical member comprising a substrate and the cured film of 14 above formed on the substrate; and
18. An electronic device comprising a substrate and the pattern of 15 above formed on the substrate.

Advantageous Effects of the Invention

This invention enables a thin film having a high refractive index and excellent transparency to be formed, and also enables a fine pattern to be formed by masking, light exposure and curing of the film, followed by, for example, alkali development.

Cured films and fine patterns produced from the inventive composition are able to exhibit the properties of high heat resistance, high refractive index and low volume shrinkage owing to the crosslinked triazine ring-containing polymer. Hence, they can be advantageously used in the fields of electronic devices and optical materials as, for example, components in the fabrication of liquid-crystal displays, organic electroluminescent (EL) displays, touch panels, photosemiconductor (LED) devices, solid-state image sensors, organic thin-film solar cells, dye-sensitized solar cells, organic thin-film transistors (TFTs), lenses, prisms, cameras, binoculars, microscopes, semiconductor steppers and the like.

In particular, because cured films and fine patterns produced from the inventive composition have a high transparency and also a high index of refraction, the visibility of transparent conductive films made of indium tin oxide (ITO), silver nanowires or the like can be improved and deterioration of the transparent conductive film can be minimized.

Moreover, high refractive index patterns produced from the inventive composition can be advantageously used in applications for which high refractive index patterns are required, such as to prevent the transparent electrodes in the above touch panels from being visually apparent, light extraction applications for organic EL displays, and black matrix applications.

BRIEF DESCRIPTION OF THE DIAGRAMS

EMBODIMENT FOR CARRYING OUT THE INVENTION

Figure 1:
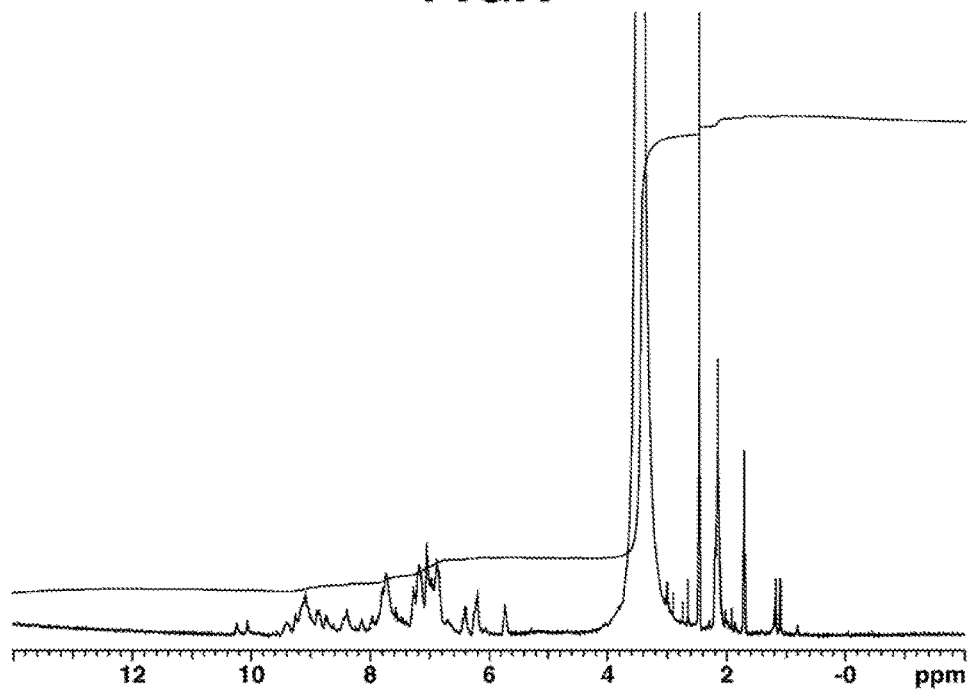
FIG. 1 shows the $^1$H-NMR spectrum for Polymeric Compound [5] obtained in Working Example 1-1.

The invention is described more fully below.

The triazine ring-containing polymer of this invention includes a recurring unit structure of formula (1) below.

[Chemical Formula 11]

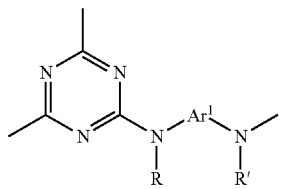

(1)

In the formula, R and R' are each independently a hydrogen atom, an alkyl group, an alkoxy group, an aryl group or an aralkyl group. From the standpoint of further increasing the refractive index, both are preferably hydrogen atoms.

In the invention, the number of carbon atoms on the alkyl group, although not particularly limited, is preferably from 1 to 20. To further increase the heat resistance of the polymer, the number of carbon atoms is more preferably from 1 to 10, and even more preferably from 1 to 3. The structure may be acyclic, branched or cyclic.

Illustrative examples of the alkyl group include methyl, ethyl, n-propyl, isopropyl, cyclopropyl, n-butyl, isobutyl, s-butyl, t-butyl, cyclobutyl, 1-methylcyclopropyl, 2-methylcyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methylcyclobutyl, 2-methylcyclobutyl, 3-methylcyclobutyl, 1,2-dimethylcyclopropyl, 2,3-dimethylcyclopropyl, 1-ethylcyclopropyl, 2-ethylcyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methylcyclopentyl, 2-methylcyclopentyl, 3-methylcyclopentyl, 1-ethylcyclobutyl, 2-ethylcyclobutyl, 3-ethylcyclobutyl, 1,2-dimethylcyclobutyl, 1,3-dimethylcyclobutyl, 2,2-dimethylcyclobutyl, 2,3-dimethylcyclobutyl, 2,4-dimethylcyclobutyl, 3,3-dimethylcyclobutyl, 1-n-propylcyclopropyl, 2-n-propylcyclopropyl, 1-isopropylcyclopropyl, 2-isopropylcyclopropyl, 1,2,2-trimethylcyclopropyl, 1,2,3-trimethylcyclopropyl, 2,2,3-trimethylcyclopropyl, 1-ethyl-2-methylcyclopropyl, 2-ethyl-1-methylcyclopropyl, 2-ethyl-2-methylcyclopropyl and 2-ethyl-3-methylcyclopropyl groups.

The number of carbon atoms on the alkoxy group, although not particularly limited, is preferably from 1 to 20. To further increase the heat resistance of the polymer, the number of carbon atoms is more preferably from 1 to 10, and even more preferably from 1 to 3. The structure of the alkyl moiety thereon may be acyclic, branched or cyclic.

Illustrative examples of the alkoxy group include methoxy, ethoxy, n-propoxy, isopropoxy, n-butoxy, isobutoxy, s-butoxy, t-butoxy, n-pentoxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy and 1-ethyl-2-methyl-n-propoxy groups.

The number of carbon atoms on the aryl group, although not particularly limited, is preferably from 6 to 40. To further increase the heat resistance of the polymer, the number of carbon atoms is more preferably from 6 to 16, and even more preferably from 6 to 13.

Illustrative examples of the aryl group include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl and 9-phenanthryl groups.

The number of carbon atoms on the aralkyl group, although not particularly limited, is preferably from 7 to 20. The alkyl moiety thereon may be acyclic, branched or cyclic.

Illustrative examples include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl groups.

$Ar^1$ represents at least one moiety selected from the group consisting of moieties of formulas (2) to (13).

[Chemical Formula 12]

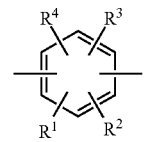

(2)

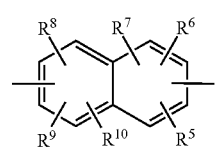

(3)

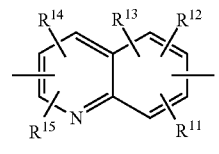

(4)

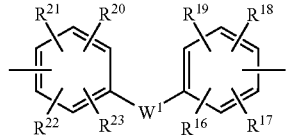

(5)

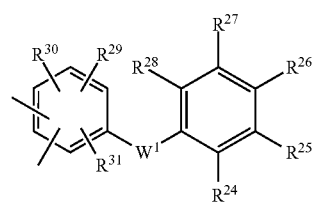

(6)

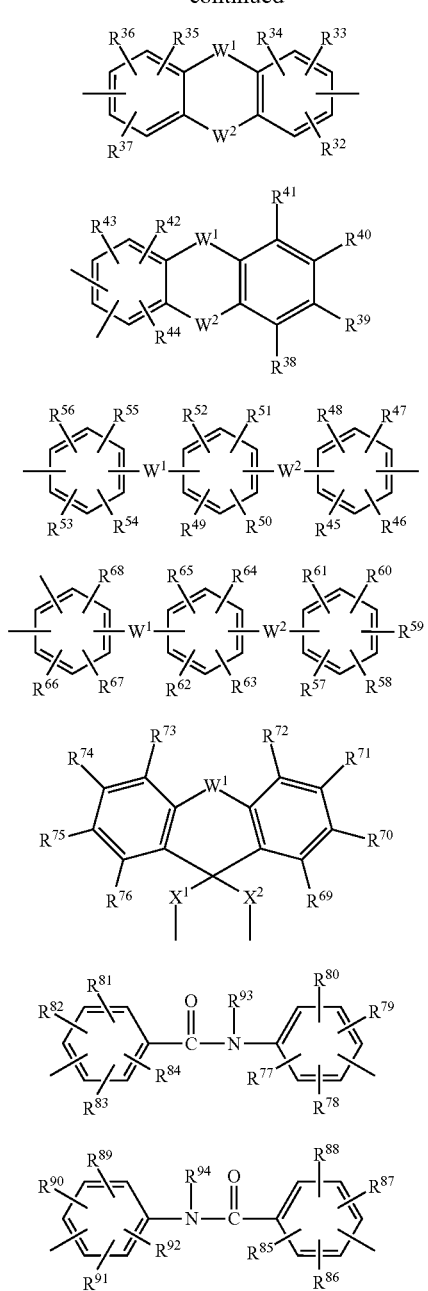

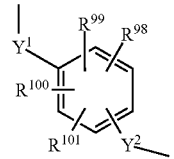

$R^1$ to $R^{92}$ above each independently represent a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure; $R^{93}$ and $R^{94}$ each represent a hydrogen atom or an alkyl group of 1 to 10 carbon atoms which may have a branched structure; and $W^1$ and $W^2$ each independently represent a single bond, $CR^{95}R^{96}$ (wherein $R^{95}$ and $R^{96}$ are each independently a hydrogen atom or an alkyl group of 1 to 10 carbon atoms which may have a branched structure, and $R^{95}$ and $R^{96}$ may together form a ring), C=O, O, S, SO, $SO_2$, or $NR^{97}$ (wherein $R^{97}$ is a hydrogen atom or an alkyl group of 1 to 10 carbon atoms which may have a branched structure).

Examples of the halogen atom include fluorine, chlorine, bromine and iodine atoms.

The alkyl groups and alkoxy groups are exemplified in the same way as above.

$X^1$ and $X^2$ each independently represent a single bond, an alkylene group of 1 to 10 carbon atoms which may have a branched structure, or a group of formula (14).

[Chemical Formula 13]

$R^{98}$ to $R^{101}$ above each independently represent a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure; and $Y^1$ and $Y^2$ each independently represent a single bond or an alkylene group of 1 to 10 carbon atoms which may have a branched structure. These halogen atoms, alkyl groups and alkoxy groups are exemplified in the same way as above.

The alkylene group of 1 to 10 carbon atoms which may have a branched structure is exemplified by methylene, ethylene, propylene, trimethylene, tetramethylene and pentamethylene groups.

In this invention, to increase the solubility of the resulting thin film or cured film in an alkali developing solution, the recurring unit structure of formula (1) has, in $Ar^1$, at least one carboxyl group on an aromatic ring.

What is meant by the recurring unit structure of formula (1) having at least one carboxyl group on an aromatic ring of $Ar^1$ is that formulas (2) to (13) all have at least one carboxyl group on at least one aromatic ring thereof. Specifically, this means that at least one of $R^1$ to $R^4$ in formula (2) is a carboxyl group, at least one of $R^5$ to $R^{10}$ in formula (3) is a carboxyl group, at least one of $R^{11}$ to $R^{15}$ in formula (4) is a carboxyl group, at least one of $R^{16}$ to $R^{23}$ in formula (5) is a carboxyl group, at least one of $R^{24}$ to $R^{31}$ in formula (6) is a carboxyl group, at least one of $R^{32}$ to $R^{37}$ in formula (7) is a carboxyl group, at least one of $R^{38}$ to $R^{44}$ in formula (8) is a carboxyl group, at least one of $R^{45}$ to $R^{56}$ in formula (9) is a carboxyl group, at least one of $R^{57}$ to $R^{68}$ in formula (10) is a carboxyl group, at least one of $R^{69}$ to $R^{76}$ in formula (11) is a carboxyl group (when $X^1$ and/or $X^2$ has formula (14), at least one of $R^{69}$ to $R^{76}$ and $R^{98}$ to $R^{101}$ is a carboxyl group), at least one of $R^{77}$ to $R^{84}$ in formula (12) is a carboxyl group, and at least one of $R^{85}$ to $R^{92}$ in formula (13) is a carboxyl group.

Although the number of carboxyl groups is not particularly limited, taking into account the balance between developability in an alkali developing solution and solubility in an organic solvent, it is preferable for there to be one carboxyl group in each of the moieties represented by formulas (2) to (13).

In particular, $Ar^1$ is preferably at least one moiety of formula (2) and formulas (5) to (13), and more preferably at least one moiety of formulas (2), (5), (7), (8) and (11) to (13). Specific examples of aryl moieties of formulas (2) to (13) include, but are not limited to, those having the formulas shown below.

[Chemical Formula 14]
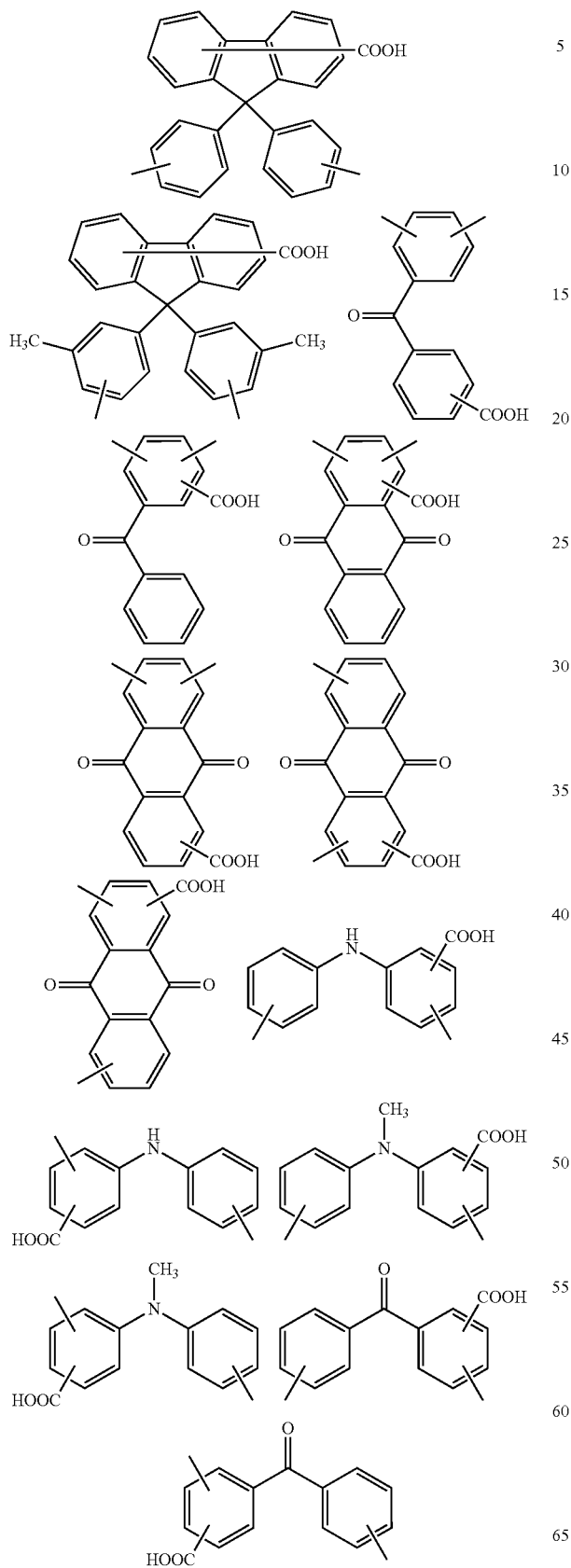
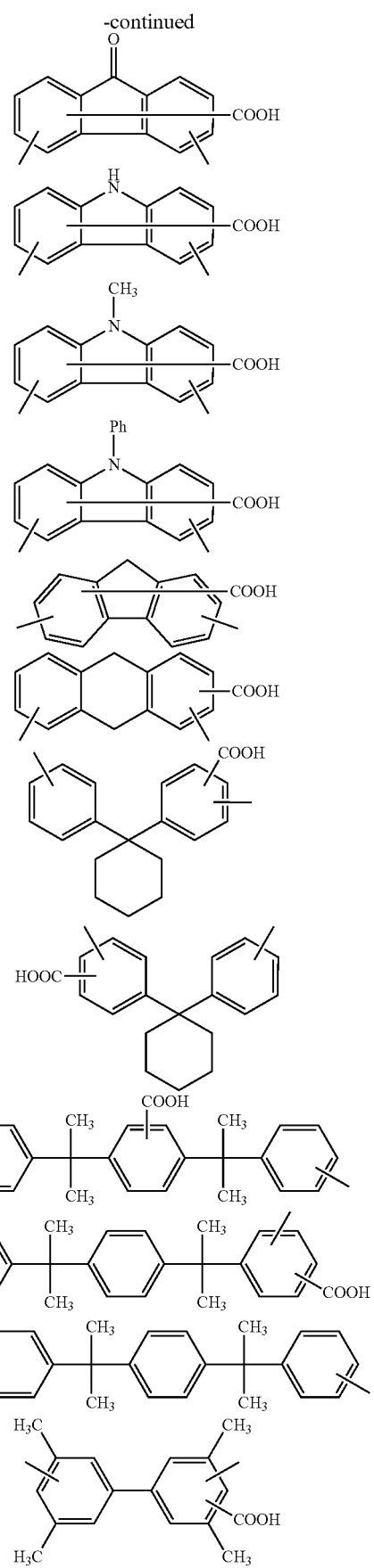

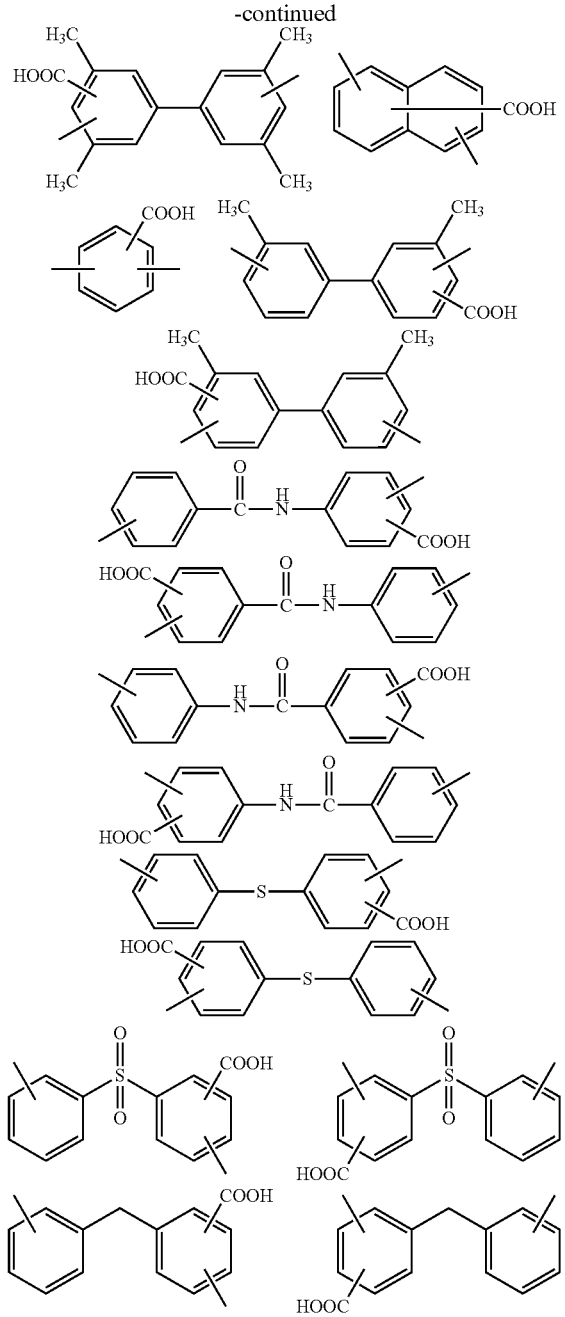
Of these, aryl moieties of the following formulas are more preferred because a polymer having a higher refractive index can be obtained.
[Chemical Formula 15]
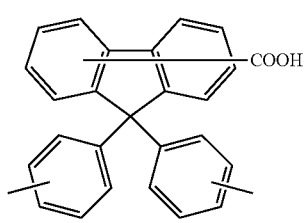
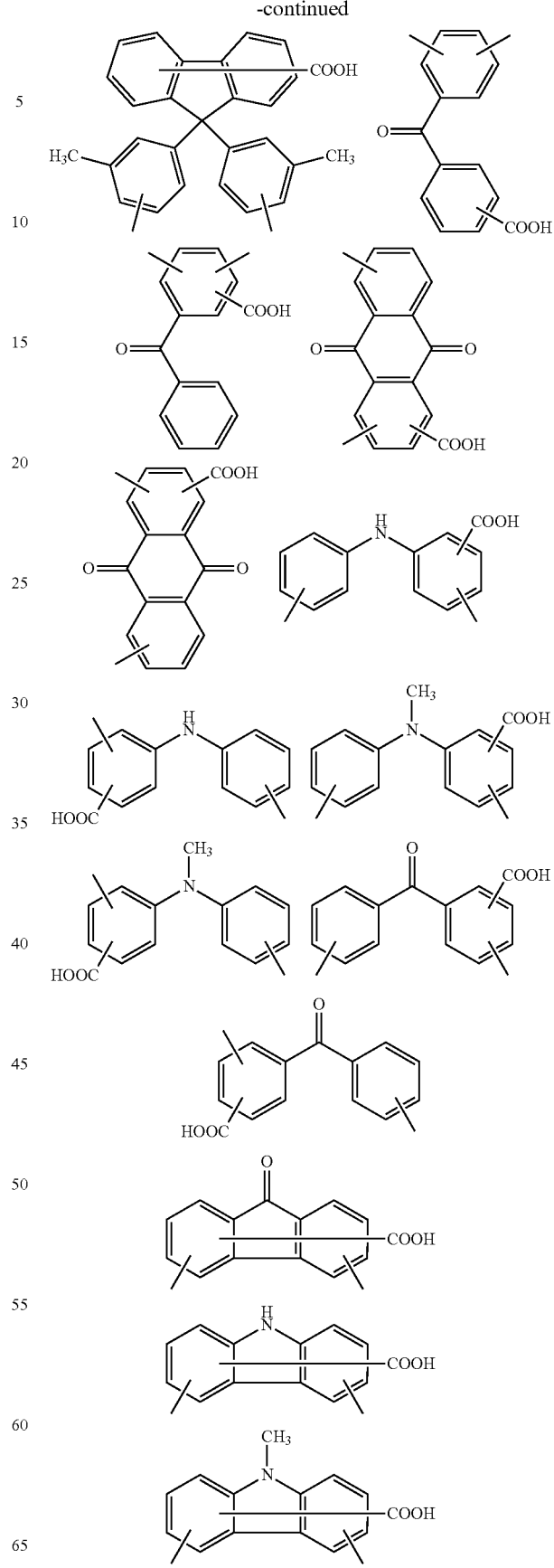

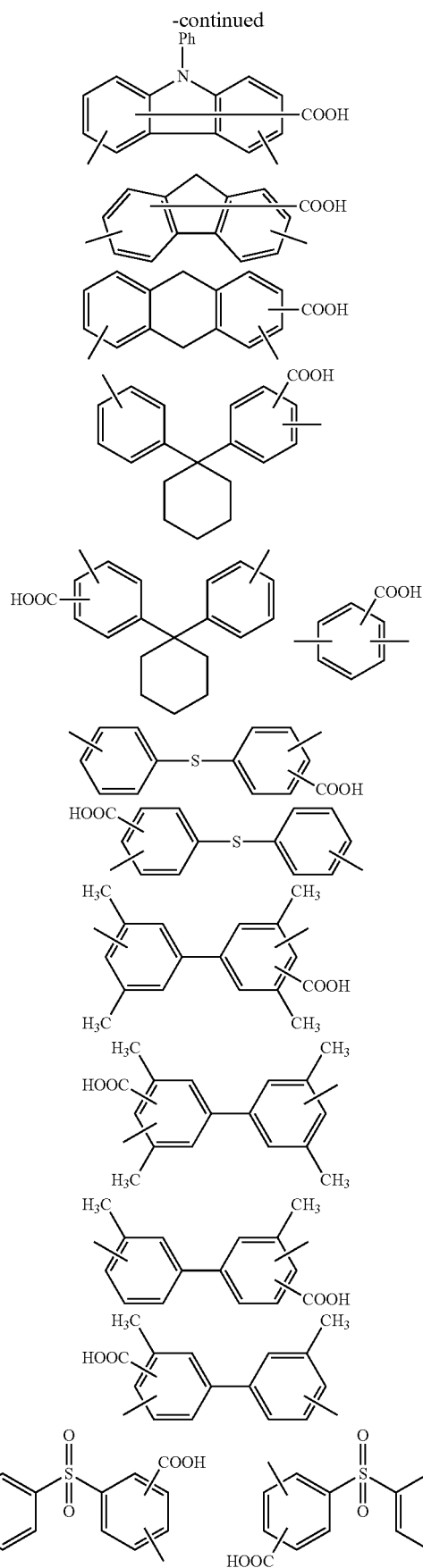

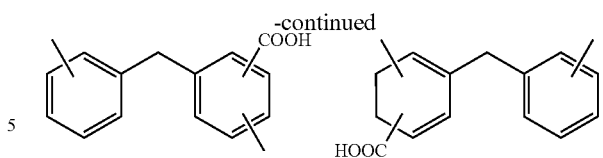

In addition, taking into account the balance between developability in an alkali developing solution and solubility in an organic solvent, Ar¹ is preferably a group of formula (15), and more preferably the group of formula (16).

[Chemical Formula 16]

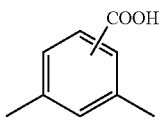
(15)

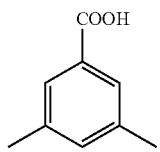
(16)

The triazine ring-containing polymer of the invention may be one consisting solely of recurring units of formula (1), although it preferably includes, together with the recurring unit structure of formula (1), recurring units represented by formula (1') that are obtained using a diamine having no carboxyl groups.

By having the triazine ring-containing polymer of the invention be such a copolymer in which two different types of diamines are used together, the solubility of the polymer in very safe solvents such as resist solvents can be further increased.

[Chemical Formula 17]

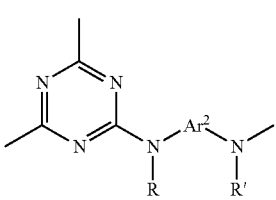
(1')

In formula (1'), R and R' are as defined above, and Ar² represents at least one moiety selected from the group consisting of moieties of formulas (2') to (13') below.

[Chemical Formula 18]

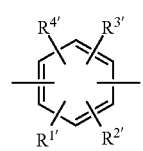
(2')

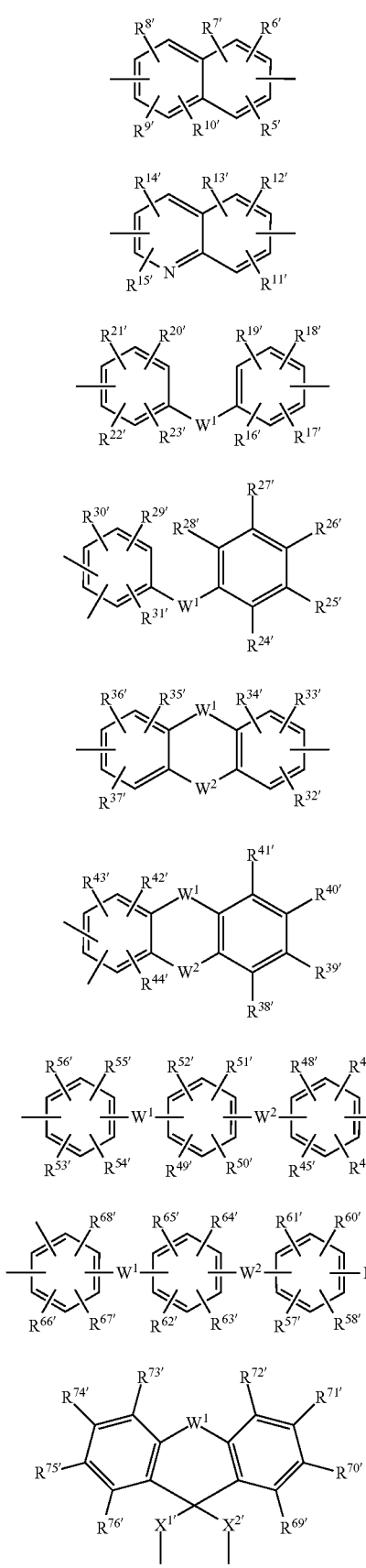

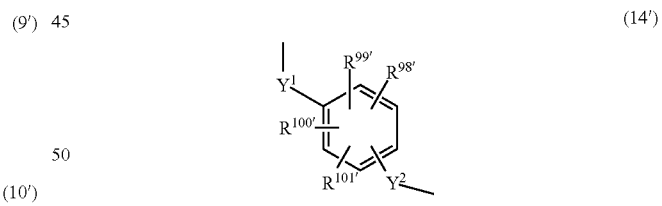

Here, $R^{1'}$ to $R^{92'}$ each independently represent a hydrogen atom, a halogen atom, a sulfo group, an alkyl group of 1 to 10 carbons which may have a branched structure, or an alkoxy group of 1 to 10 carbons which may have a branched structure; $R^{93}$ and $R^{94}$ each represent a hydrogen atom or an alkyl group of 1 to 10 carbons which may have a branched structure; and $W^1$ and $W^2$ each independently represent a single bond, $CR^{95}R^{96}$ (wherein $R^{95}$ and $R^{96}$ are each independently a hydrogen atom or an alkyl group of 1 to 10 carbons which may have a branched structure, and $R^{95}$ and $R^{96}$ may together form a ring), C=O, O, S, SO, $SO_2$, or $NR^{97}$ (wherein $R^{97}$ is a hydrogen atom or an alkyl group of 1 to 10 carbons which may have a branched structure). These halogen atoms, alkyl groups and alkoxy groups are exemplified in the same way as above.

Also, $X^{1'}$ and $X^{2'}$ each independently represent a single bond, an alkylene group of 1 to 10 carbon atoms which may have a branched structure, or a group of formula (14').

[Chemical Formula 19]

(14')

Here, $R^{98'}$ to $R^{101'}$ each independently represent a hydrogen atom, a halogen atom, a sulfo group, an alkyl group of 1 to 10 carbon atoms which may have a branched structure, or an alkoxy group of 1 to 10 carbon atoms which may have a branched structure; and $Y^1$ and $Y^2$ are as defined above. These halogen atoms, alkyl groups and alkoxy groups are exemplified in the same way as above.

In particular, $Ar^2$ is preferably at least one moiety of formula (2') and formulas (5') to (13'), and more preferably at least one moiety of formulas (2'), (5'), (7'), (8') and (11') to (13'). Specific examples of aryl moieties of formulas (2') to (13') include, but are not limited to, those having the formulas shown below.

[Chemical Formula 20]
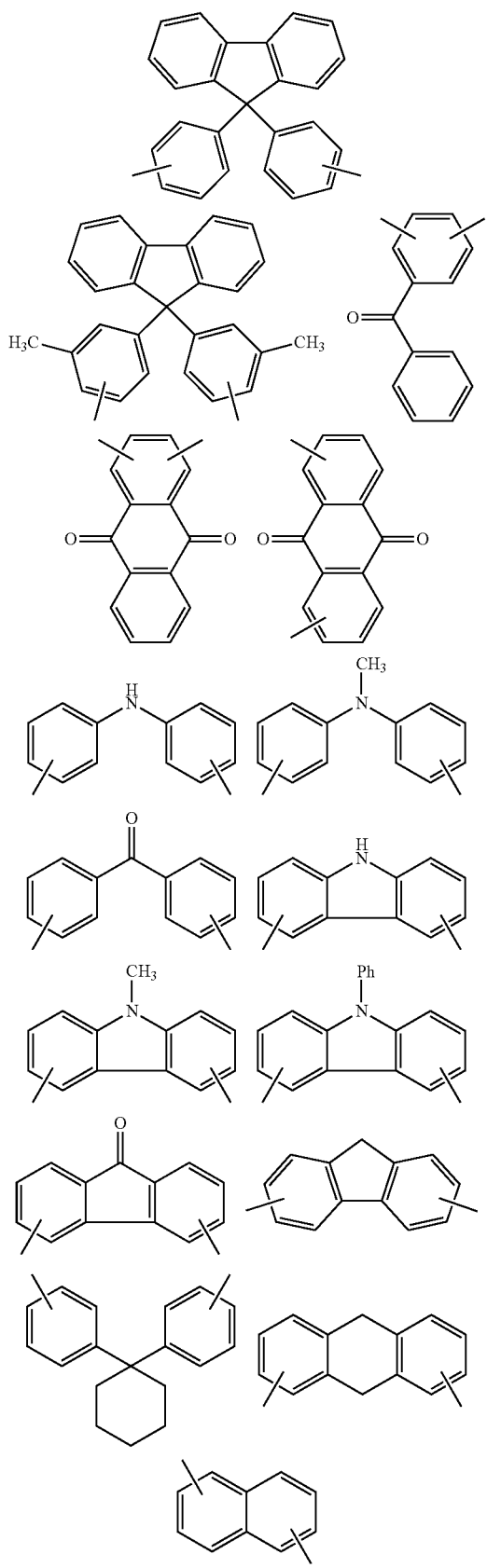
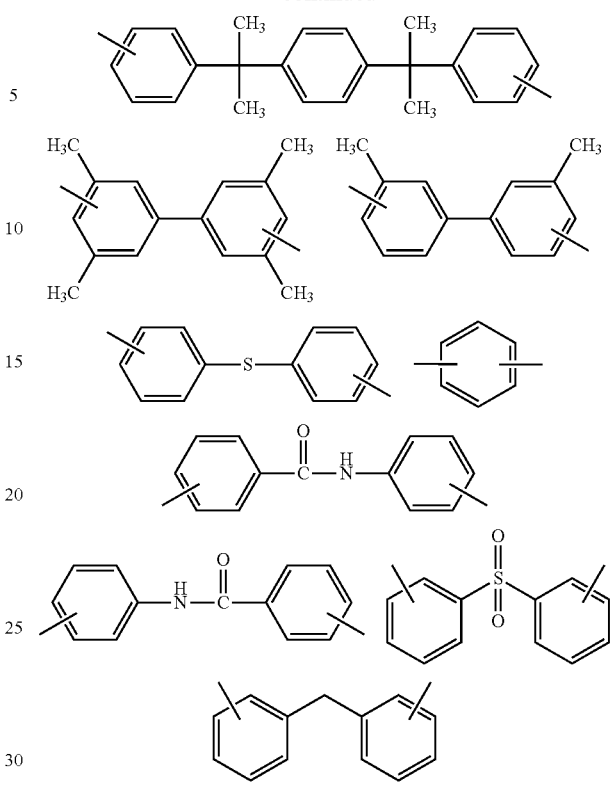
Of these, aryl moieties of the following formulas are more preferred because a polymer having a higher refractive index can be obtained.
[Chemical Formula 21]
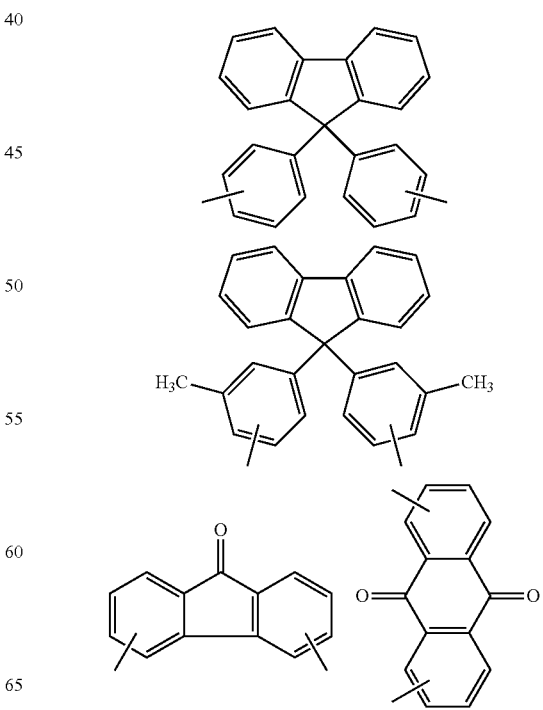

-continued

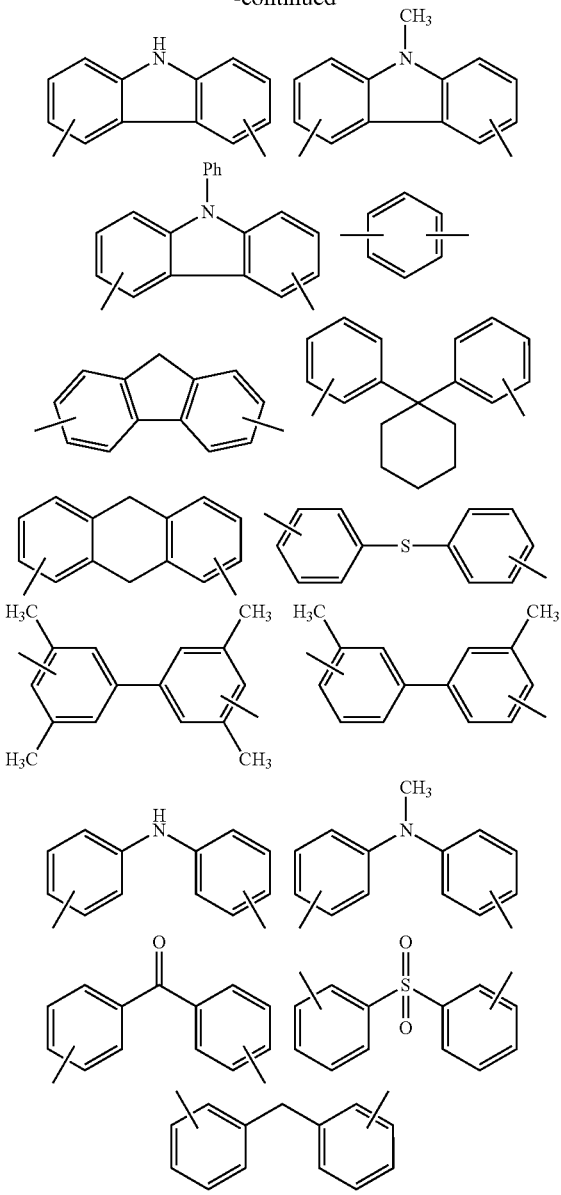

In particular, to further increase the solubility of the triazine ring-containing polymer in very safe solvents such as resist solvents, $Ar^2$ is preferably the m-phenylene group shown in formula (17).

[Chemical Formula 22]

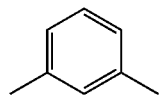

(17)

In cases where the polymer is such a copolymer, the ratio of the content of recurring units of formula (1) to the content of recurring units of formula (1') is not particularly limited. However, taking into account the balance between the alkali solubility and the solubility in organic solvents, this ratio, expressed as a molar ratio, is preferably from about 50:50 to about 99:1, more preferably from 60:40 to 90:10, and even more preferably from 65:35 to 80:20.

Moreover, in cases where the polymer is a copolymer, in addition to the recurring units of formulas (1) and (1') above, recurring units of formula (1") are also included in the polymer obtained.

[Chemical Formula 23]

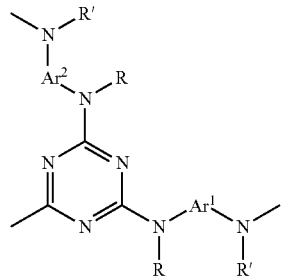

(1")

In the present invention, examples of especially preferred triazine ring-containing polymers include those of formulas (19) to (22) and (19') to (22') below:

[Chemical Formula 24]

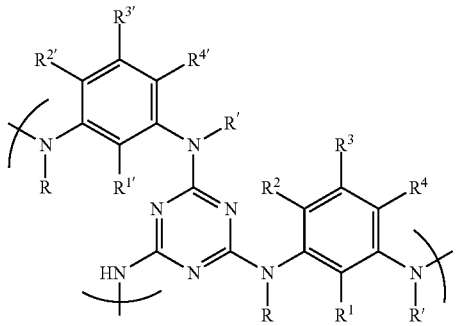

(19)

(wherein R, R', $R^1$ to $R^4$ and $R^{1'}$ to $R^{4'}$ are as defined above, although only one of $R^1$ to $R^4$ is a carboxyl group);

[Chemical Formula 25]

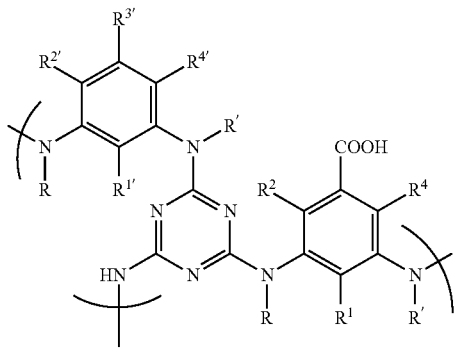

(20)

(wherein R, R' and $R^{1'}$ to $R^{4'}$ are as defined above, and $R^1$, $R^2$ and $R^4$ are groups other than carboxyl groups from among the above-mentioned groups);

[Chemical Formula 26]

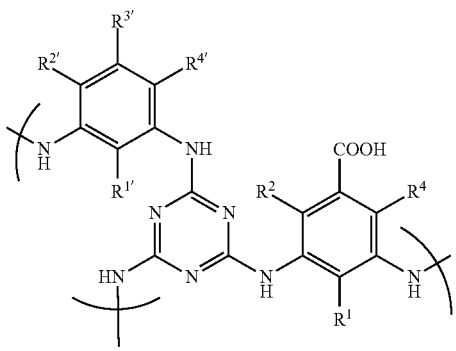

(21)

(wherein $R^{1'}$ to $R^{4'}$ are as defined above, and $R^1$, $R^2$ and $R^4$ are groups other than carboxyl groups from among the above-mentioned groups);

[Chemical Formula 27]

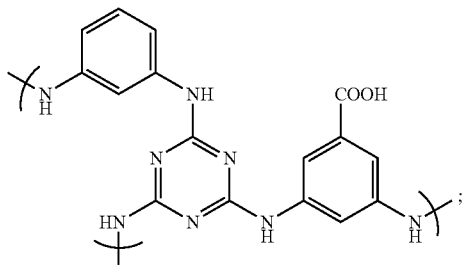

(22)

[Chemical Formula 28]

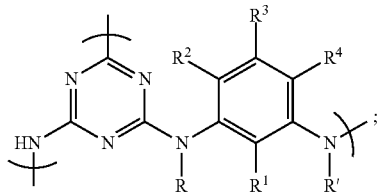

(19')

(wherein R, R' and $R^1$ to $R^4$ are as defined above, although only one of $R^1$ to $R^4$ is a carboxyl group);

[Chemical Formula 29]

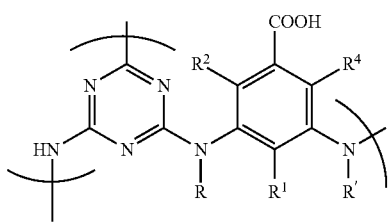

(20')

(wherein R and R' are as defined above, and $R^1$, $R^2$ and $R^4$ are groups other than carboxyl groups from among the above-mentioned groups);

[Chemical Formula 30]

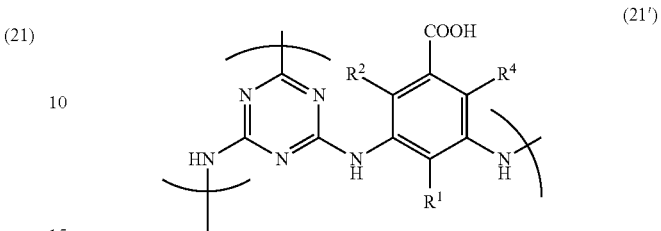

(21')

(wherein $R^1$, $R^2$ and $R^4$ are groups other than carboxyl groups from among the above-mentioned groups); and

[Chemical Formula 31]

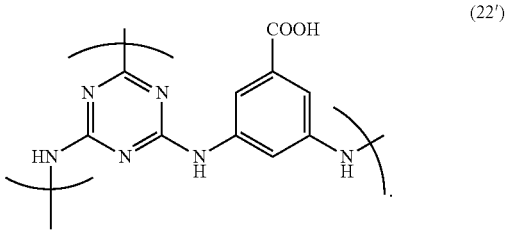

(22')

The polymer of the invention has a weight-average molecular weight which, although not particularly limited, is preferably between 500 and 500,000, and more preferably between 500 and 100,000. To further enhance the heat resistance and lower the shrinkage ratio, the Mw is preferably at least 2,000. To further increase the solubility and lower the viscosity of the resulting solution, the weight-average molecular weight is preferably 50,000 or less, more preferably 30,000 or less, and even more preferably 10,000 or less.

The weight-average molecular weight in this invention is the average molecular weight measured by gel permeation chromatography (GPC) against a polystyrene standard.

The triazine ring-containing polymer (hyperbranched polymer) of the invention may be prepared by the method disclosed in above-cited Patent Document 1.

For example, as shown in Scheme 1 below, a triazine ring-containing polymer (22) can be obtained by reacting a triazine compound (23), a carboxyl group-containing aryldiamino compound (24) and a carboxyl group-lacking aryldiamino compound (25) in a suitable organic solvent.

Scheme 1

[Chemical Formula 32]

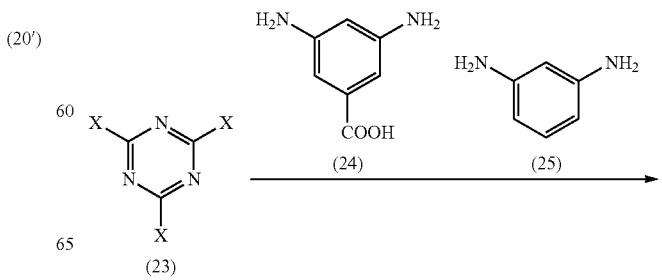

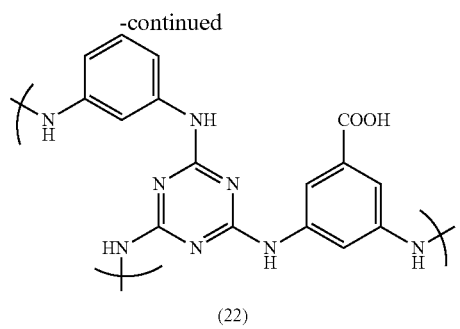

(22)

In the above formulas, each X independently represents a halogen atom.

In the above reaction, the diamino compounds (24) and (25) may be charged in any ratio so long as the target polymer can be obtained, although the combined amount of diamino compounds (24) and (25) per equivalent of the triazine compound (23) is preferably from 0.01 to 10 equivalents, and more preferably from 1 to 5 equivalents. The charging ratio of the carboxyl group-containing aryldiamino compound (24) and the carboxyl group-lacking aryldiamino compound (25), expressed as the molar ratio "diamino compound (24) : diamino compound (25)", is preferably from about 50:50 to about 99:1, more preferably from 60:40 to 90:10, and even more preferably from 65:35 to 80:20.

Diamino compounds (24) and (25) may be added neat or may be added as a solution obtained by dissolution in an organic solvent, although the latter approach is preferred for reasons having to do with the ease of the operations and the controllability of the reaction.

The reaction temperature should be suitably set in the range from the melting point to the boiling point of the solvent used, although the temperature is preferably from about −30° C. to about 150° C., and more preferably from −10° C. to 100° C.

Various solvents that are commonly used in this type of reaction may be used as the organic solvent. Illustrative examples include tetrahydrofuran, dioxane, dimethylsulfoxide, amide solvents such as N,N-dimethylformamide, N-methyl-2-pyrrolidone, tetramethylurea, hexamethylphosphoramide, N,N-dimethylacetamide, N-methyl-2-piperidone, N,N-dimethylethyleneurea, N,N,N',N'-tetramethylmalonamide, N-methylcaprolactam, N-acetylpyrrolidine, N,N-diethylacetamide, N-ethyl-2-pyrrolidone, N,N-dimethylpropionamide, N,N-dimethylisobutyramide, N-methylformamide and N,N'-dimethylpropylene urea; and mixed solvents thereof.

Of these, N,N-dimethylformamide, dimethylsulfoxide, N-methyl-2-pyrrolidone, N,N-dimethylacetamide and mixed solvents thereof are preferred. N,N-dimethylacetamide and N-methyl-2-pyrrolidone are especially preferred.

In the Scheme 1 reactions above, various bases which are commonly used during or after polymerization may be added.

Illustrative examples of such bases include potassium carbonate, potassium hydroxide, sodium carbonate, sodium hydroxide, sodium bicarbonate, sodium ethoxide, sodium acetate, lithium carbonate, lithium hydroxide, lithium oxide, potassium acetate, magnesium oxide, calcium oxide, barium hydroxide, trilithium phosphate, trisodium phosphate, tripotassium phosphate, cesium fluoride, aluminum oxide, ammonia, n-propylamine, trimethylamine, triethylamine, diisopropylamine, diisopropylethylamine, N-methylpiperidine, 2,2,6,6-tetramethyl-N-methylpiperidine, pyridine, 4-dimethylaminopyridine and N-methylmorpholine.

The amount of base added per equivalent of the triazine compound (23) is preferably from 1 to 100 equivalents, and more preferably from 1 to 10 equivalents. These bases may be used in the form of an aqueous solution.

It is preferable for there to be no residual starting ingredients within the resulting polymer, although the residual presence of some starting material is acceptable so long as this does not detract from the advantageous effects of the invention.

Following reaction completion, the product can be easily purified by a suitable technique such as re-precipitation.

It is preferable for the triazine ring-containing polymer of the invention to have at least one triazine ring end, and for at least a portion of the triazine ring ends to be capped with an arylamino group that may be substituted with an alkyl, alkoxy, aryl or aralkyl group.

The aryl group on the arylamino group is exemplified in the same way as described above, with a phenyl group being preferred.

In particular, from the standpoint of ensuring the solubility of the triazine ring-containing polymer in very safe solvents such as resist solvents, the arylamino group is more preferably substituted with an alkyl, alkoxy, aryl or aralkyl group, even more preferably has an alkyl, alkoxy, aryl or aralkyl group at at least one ortho position to the amino group, and still more preferably has an alkyl, alkoxy, aryl or aralkyl group at both ortho positions to the amino group.

The substituent on the arylamino group is preferably an alkyl group of 1 to 20 carbon atoms, more preferably an alkyl group of 1 to 10 carbon atoms, and even more preferably an alkyl group of 1 to 5 carbon atoms.

These alkyl, alkoxy, aryl and aralkyl groups are exemplified in the same way as described above.

For the above reasons, the arylamino group is preferably one having an alkyl group of 1 to 20 carbon atoms at at least one ortho position to this amino group, more preferably one having an alkyl group of 1 to 5 carbon atoms at both ortho position, and most preferably the phenylamino group having methyl groups at both ortho positions shown in formula (18) below.

[Chemical Formula 33]

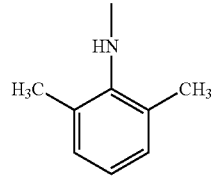

(18)

A known method may be used as the end-capping method. For example, the triazine ring-containing polymer (22) obtained by the above method may be treated with, as an end-capping agent that provides an end-capping group, the above-described arylamine compound having a given substituent.

In this case, the amount of end-capping agent used per equivalent of halogen atoms from the excess triazine compound not utilized in the polymerization reaction is preferably from about 0.05 to about 10 equivalents, more preferably from 0.1 to 5 equivalents, and even more preferably from 0.5 to 2 equivalents.

The reaction solvent and temperature are exemplified by the same conditions as mentioned above for Scheme 1, and the end-capping agent may be charged at the same time as the aryldiamine compound.

End-capping with two or more types of groups may be carried out by using an arylamine compound without any substituents together with the above-described arylamine compound having a given substituent.

The triazine ring-containing polymer of the invention can be suitably used, together with a crosslinking agent, as a film-forming composition or a patterning composition.

The crosslinking agent is not particularly limited, provided it is a compound having a substituent that can react with the triazine ring-containing polymer.

Such compounds are exemplified by melamine compounds having a crosslink-forming substituent such as a methylol group or a methoxymethyl group, substituted urea compounds, compounds having a crosslink-forming substituent such as an epoxy group or an oxetane group, blocked isocyanate-containing compounds, acid anhydride-containing compounds, compounds having a (meth)acrylic group, and phenoplast compounds. From the standpoint of heat resistance and storage stability, compounds having an epoxy group, a blocked isocyanate group or a (meth)acrylic group are preferred. Compounds having a blocked isocyanate group, and polyepoxy compounds and/or poly(meth)acrylic compounds which provide a photocurable composition even without the use of an initiator are especially preferred.

When used for polymer end group treatment, these compounds should have at least one crosslink-forming substituent. When used for crosslinking treatment between polymers, they must have at least two crosslink-forming substituents.

The polyepoxy compound is not particularly limited, provided it has at least two epoxy groups on the molecule.

Illustrative examples include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidylphenyl glycidyl ether, 1,1,3-tris[p-(2,3-epoxypropoxy)phenyl]propane, 1,2-cyclohexanedicarboxylic acid diglycidyl ester, 4,4'-methylenebis(N,N-diglycidylaniline), 3,4-epoxycyclohexylmethyl-3,4-epoxycyclohexane carboxylate, trimethylolethane triglycidyl ether, bisphenol A diglycidyl ether and pentaerythritol polyglycidyl ether.

Examples of commercial products that may be used include epoxy resins having at least two epoxy groups, such as YH-434 and YH-434L (from Tohto Kasei Co., Ltd.); epoxy resins having a cyclohexene oxide structure, such as Epolead GT-401, GT-403, GT-301 and GT-302, and also Celloxide 2021 and Celloxide 3000 (all from Daicel Chemical Industries, Ltd.); bisphenol A-type epoxy resins such as Epikote (now "jER") 1001, 1002, 1003, 1004, 1007, 1009, 1010 and 828 (all from Japan Epoxy Resin Co., Ltd.); bisphenol F-type epoxy resins such as Epikote (now "jER") 807 (Japan Epoxy Resin Co., Ltd.); phenol-novolak type epoxy resins such as Epikote (now "jER") 152 and 154 (Japan Epoxy Resin Co., Ltd.), and EPPN 201 and 202 (Nippon Kayaku Co., Ltd.); cresol-novolak type epoxy resins such as EOCN-102, 103S, 104S, 1020, 1025 and 1027 (Nippon Kayaku Co., Ltd.), and Epikote (now "jER") 180S75 (Japan Epoxy Resin Co., Ltd.); alicyclic epoxy resins such as Denacol EX-252 (Nagase ChemteX Corporation), CY175, CY177 and CY179 (Ciba-Geigy AG), Araldite CY-182, CY-192 and CY-184 (Ciba-Geigy AG), Epiclon 200 and 400 (DIC Corporation), Epikote (now "jER") 871 and 872 (Japan Epoxy Resin Co., Ltd.), and ED-5661 and ED-5662 (Celanese Coating KK); and aliphatic polyglycidyl ethers such as Denacol EX-611, EX-612, EX-614, EX-622, EX-411, EX-512, EX-522, EX-421, EX-313, EX-314 and EX-321 (Nagase ChemteX. Corporation).

The poly(meth)acrylic compounds are not particularly limited, provided they have two or more (meth)acrylic groups per molecule.

Illustrative examples include ethylene glycol diacrylate, ethylene glycol dimethacrylate, polyethylene glycol diacrylate, polyethylene glycol dimethacrylate, ethoxylated bisphenol A diacrylate, ethoxylated bisphenol A dimethacrylate, ethoxylated trimethylolpropane triacrylate, ethoxylated trimethylolpropane trimethacrylate, ethoxylated glycerol triacrylate, ethoxylated glycerol trimethacrylate, ethoxylated pentaerythritol tetraacrylate, ethoxylated pentaerythritol tetramethacrylate, ethoxylated dipentaerythritol hexaacrylate, polyglycerol monoethylene oxide polyacrylate, polyglycerol polyethylene glycol polyacrylate, dipentaerythritol hexaacrylate, dipentaerythritol hexamethacrylate, neopentyl glycol diacrylate, neopentyl glycol dimethacrylate, pentaerythritol triacrylate, pentaerythritol trimethacrylate, trimethylolpropane triacrylate, trimethylolpropane trimethacrylate, tricyclodecane dimethanol diacrylate, tricyclodecane dimethanol dimethacrylate, 1,6-hexanediol diacrylate, 1,6-hexanediol dimethacrylate and polybasic acid-modified acrylic oligomers.

The poly(meth)acrylic compound may be acquired as a commercial product, illustrative examples of which include NK Ester A-200, A-400, A-600, A-1000, A-9300 (tris(2-acryloyloxyethyl) isocyanurate), A-9300-1CL, A-TMPT, UA-53H, 1G, 2G, 3G, 4G, 9G, 14G, 23G, ABE-300, A-BPE-4, A-BPE-6, A-BPE-10, A-BPE-20, A-BPE-30, BPE-80N, BPE-100N, BPE-200, BPE-500, BPE-900, BPE-1300N, A-GLY-3E, A-GLY-9E, A-GLY-20E, A-TMPT-3EO, A-TMPT-9EO, AT-20E, ATM-4E, ATM-35E, A-DPH, A-TMPT, A-DCP, A-HD-N, TMPT, DCP, NPG, HD-N, A-DPH-48E and A-DPH-96E, and also NK Oligo U-15HA and NK Polymer Vanaresin GH-1203 (all from Shin-Nakamura Chemical Co., Ltd.); KAYARAD® DPHA, NPGDA, PET30, DPEA-12, PEG400DA, THE-330, RP-1040 and DN-0075 (all from Nippon Kayaku Co., Ltd.); Aronix® M-210, M-303, M-305, M-306, M-309, M-310,M-313, M-315, M-321, M-350, M-360, M-400, M-402, M-403, M-404, M-405, M-406, M-408, M-450, M-452 and M-460 (from Toagosei Co., Ltd.); and DPGDA, HDDA, TPGDA, HPNDA, PETIA, PETRA, TMPTA, TMPEOTA, EBE-CRYL 11, 40, 135, 140, 145, 150, 180, 1142, 204, 205, 210, 215, 220, 230, 244, 245, 265, 270, 280/15IB, 284, 294/25HD, 303, 436, 438, 446, 450, 524, 525, 600, 605, 645, 648, 767, 770, 800, 810, 811, 812, 846, 851, 852, 853, 860, 884, 885, 1259, 1290, 1606, 1830, 1870, 3500, 3603, 3608, 3700, 3701, 3702, 3703, 3708, 4820, 4858, 5129, 6040, 8210, 8454, 8301R, 8307, 8311, 8402, 8405, 8411, 8465, 8701, 8800, 8804, 8807, 9270, 9227EA and 936, KRM8200, 8200AE, 7735, 8296, 08452, 8904, 8528 and 8912, OTA480, IRR214-K, 616, 679, 742 and 793, and PEG400DA-D (ACA) Z200M, Z230AA, Z250, Z251, Z300, Z320 and Z254F (all from Daicel-Allnex Ltd.).

The above polybasic acid-modified acrylic oligomers are also available as commercial products, illustrative examples of which include Aronix M-510 and 520 (Toagosei Co., Ltd.).

The acid anhydride compounds are not particularly limited, provided they are carboxylic acid anhydrides obtained by the dehydration/condensation of two molecules of carboxylic acid. Illustrative examples include those having one acid anhydride group per molecule, such as phthalic anhydride, tetrahydrophthalic anhydride, hexahydrophthalic anhydride, methyl tetrahydrophthalic anhydride, methyl hexahydrophthalic anhydride, nadic anhydride, methyl nadic anhydride, maleic anhydride, succinic anhydride, octyl succinic anhydride and dodecenyl succinic anhydride; and those having two acid anhydride groups per molecule, such as 1,2,3,4-cyclobutanetetracarboxylic dianhydride, pyromellitic anhydride, 3,4-dicarboxy-1,2,3,4-tetrahydro-1-naphthalenesuccinic dianhydride, bicyclo[3.3.0]octane-2,4,6,8-tetracarboxylic dianhydride, 5-(2,5-dioxotetrahydro-3-furanyl)-3-methyl-3-cyclohexene-1,2-dicarboxylic anhydride, 1,2,3,4-butanetetracarboxylic dianhydride, 3,3',4,4'-benzophenonetetracarboxylic dianhydride, 3,3', 4,4'-biphenyltetracarboxylic dianhydride, 2,2-bis(3,4-dicarboxyphenyl)hexafluoropropane dianhydride and 1,3-dimethyl-1,2,3,4-cyclobutanetetracarboxylic dianhydride.

The blocked isocyanate-containing compounds are not particularly limited, provided they are compounds having at least two blocked isocyanate groups per molecule, i.e., isocyanate groups (—NCO) that have been blocked with suitable protecting groups, and in which, upon exposure of the compound to an elevated temperature during heat curing, the protecting groups (blocking moieties) are removed by thermal dissociation and the isocyanate groups that form as a result induce crosslinking reactions with the resin. Such compounds are exemplified by compounds having at least two groups of the following formula (which groups may be the same or may each differ) per molecule.

[Chemical Formula 34]

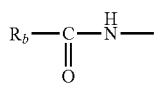

In the formula, $R_b$ is an organic group on the blocking moiety.

Such a compound can be obtained by, for example, reacting a suitable blocking agent with a compound having two or more isocyanate groups per molecule.

Examples of compounds having two or more isocyanate groups per molecule include polyisocyanates such as isophorone diisocyanate, 1,6-hexamethylene diisocyanate, methylenebis(4-cyclohexyl isocyanate) and trimethylhexamethylene diisocyanate, and also dimers and trimers thereof, as well as the reaction products of these with diols, triols, diamines or triamines.

Examples of the blocking agent include alcohols such as methanol, ethanol, isopropanol, n-butanol, 2-ethoxyhexanol, 2-N,N-dimethylaminoethanol, 2-ethoxyethanol and cyclohexanol; phenols such as phenol, o-nitrophenol, p-chlorophenol, and o-, m- and p-cresol; lactams such as ε-caprolactam; oximes such as acetone oxime, methyl ethyl ketone oxime, methyl isobutyl ketone oxime, cyclohexanone oxime, acetophenone oxime and benzophenone oxime; pyrazoles such as pyrazole, 3,5-dimethylpyrazole and 3-methylpyrazole; and thiols such as dodecanethiol and benzenethiol.

Compounds containing blocked isocyanate groups may also be acquired as commercial products, examples of which include Takenate® B-830, B-815N, B-842N, B-870N, B-874N, B-882N, B-7005, B7030, B-7075 and B-5010 (all from Mitsui Chemicals Polyurethanes, Inc.); Duranate® 17B-60PX, TPA-B80E, MF-B60X, MF-K60X and E402-B80T (all from Asahi Kasei Chemicals Corporation); Karen-zMOI-BM™ (Showa Denko KK); and Trixene BI® 7950, 7951, 7960, 7961, 7982, 7990, 7991 and 7992 (all from Baxenden Chemical).

The aminoplast compounds are not particularly limited, provided they are compounds which have at least two methoxymethylene groups per molecule. Examples include the following melamine compounds: compounds of the Cymel® series, such as hexamethoxymethylmelamine (Cymel® 303), tetrabutoxymethylglycoluril (Cymel® 1170) and tetramethoxymethylbenzoguanamine (Cymel® 1123) (all from Nihon Cytec Industries, Inc.); and compounds of the Nikalac® series, including the methylated melamine resins Nikalac® MW-30HM, MW-390, MW-100LM and MX-750LM, and the methylated urea resins Nikalac® MX-270, MX-280 and MX-290 (all from Sanwa Chemical Co., Ltd.).

The oxetane compounds are not particularly limited, provided they are compounds which have at least two oxetanyl groups per molecule. Examples include the oxetanyl group-containing compounds OXT-221, OX-SQ-H and OX-SC (from Toagosei Co., Ltd.).

Phenoplast compounds are compounds which have at least two hydroxymethylene groups per molecule. Upon exposure to an elevated temperature during heat curing, crosslinking reactions proceed by way of dehydration/condensation reactions with the polymer of the invention.

Examples of phenoplast compounds include 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, 2,2-bis(4-hydroxy-3,5-dihydroxymethylphenyl)propane, bis(3-formyl-4-hydroxyphenyl)methane, bis(4-hydroxy-2,5-dimethylphenyl)formylmethane and α,α-bis(4-hydroxy-2,5-dimethylphenyl)-4-formyltoluene.

The phenoplast compound may also be acquired as a commercial product, illustrative examples of which include 26DMPC, 46DMOC, DM-BIPC-F, DM-BIOC-F, TM-BIP-A, BISA-F, BI25X-DF and BI25X-TPA (all from Asahi Organic Chemicals Industry Co., Ltd.).

Of these, both in terms of being able to suppress a decline in the refractive index due to inclusion of a crosslinking agent and also rapid progress of the curing reaction, poly (meth)acrylic compounds are preferred. In particular, owing to their excellent compatibility with triazine ring-containing polymers, poly(meth)acrylic compounds having the isocyanuric acid skeleton shown below are more preferred.

Poly(meth)acrylic compounds having such skeletons are exemplified by NK Ester A-9300 and A-9300-1CL (both available from Shin-Nakamura Chemical Co., Ltd.).

[Chemical Formula 35]

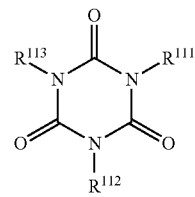

Here, $R^{111}$ to $R^{113}$ are each independently a monovalent organic group having at least one (meth)acrylic group on the end.

To further enhance the rate of cure and also increase the solvent resistance, acid resistance and alkali resistance of the resulting cured film, it is advantageous to use a poly(meth) acrylic compound which at 25° C. is a liquid and has a viscosity of 5,000 mPa·s or less, preferably from 1 to 3,000 mPa·s, more preferably from 1 to 1,000 mPa·s, and even more preferably from 1 to 500 mPa·s (referred to below as a "low-viscosity crosslinking agent"), either singly or as a combination of two or more thereof, or in combination with the above-described poly(meth)acrylic compound having an isocyanuric acid skeleton.

Such a low-viscosity crosslinking agent too may be acquired as a commercial product. Examples include, of the above-mentioned poly(meth)acrylic compounds, crosslinking agents in which the chain lengths between (meth)acrylic groups are relatively long, such as NK Ester A-GLY-3E (85 mPa·s at 25° C.), A-GLY-9E (95 mPa·s at 25° C.), A-GLY-20E (200 mPa·s at 25° C.), A-TMPT-3EO (60 mPa·s at 25° C.), A-TMPT-9EO, ATM-4E (150 mPa·s at 25° C.) and ATM-35E (350 mPa·s at 25° C.) (all from Shin-Nakamura Chemical Co., Ltd.).

In addition, to enhance the alkali resistance of the resulting cured film, it is preferable to use a combination of at least one of NK Ester A-GLY-20E (Shin-Nakamura Chemical Co., Ltd.) and NK Ester ATM-35E (Shin-Nakamura Chemical Co., Ltd.) with the above-described poly(meth)acrylic compound having an isocyanuric acid skeleton.

Also, in cases where a thin-film made of the triazine ring-containing polymer of the invention is laminated with a protective film such as a PET or polyolefin film and irradiated with light through the protective film, oxygen inhibition does not occur in the laminated film, enabling good curability to be achieved. Because there is a need in such cases to peel off the protective film after curing, it is preferable to use a polybasic acid-modified acrylic oligomer that provides a thin film having good peelability.

The above crosslinking agent may be used singly, or two or more may be used in combination. The amount of crosslinking agent used per 100 parts by weight of the triazine ring-containing polymer is preferably from 1 to 100 parts by weight. From the standpoint of solvent resistance, the lower limit is preferably 2 parts by weight, and more preferably 5 parts by weight. From the standpoint of controlling the refractive index, the upper limit is preferably 20 parts by weight, and more preferably 15 parts by weight.

Initiators corresponding to the respective crosslinking agents may also be included in the composition of the invention. As noted above, when a polyepoxy compound and/or a poly(meth)acrylic compound are used as crosslinking agents, photocuring proceeds even without the use of an initiator, giving a cured film, although it is acceptable to use an initiator in such cases.

When a polyepoxy compound is used as the crosslinking agent, a photoacid generator or a photobase generator may be used as the initiator.

The photoacid generator used may be one that is suitably selected from among known photoacid generators. For example, use may be made of onium salt derivatives such as diazonium salts, sulfonium salts or iodonium salts.

Illustrative examples include aryldiazonium salts such as phenyldiazonium hexafluorophosphate, 4-methoxyphenyldiazonium hexafluoroantimonate and 4-methylphenyldiazonium hexafluorophosphate; diaryliodonium salts such as diphenyliodonium hexafluoroantimonate, di(4-methylphenyl)iodonium hexafluorophosphate and di(4-tert-butylphenyl)iodonium hexafluorophosphate; and triarylsulfonium salts such as triphenylsulfonium hexafluoroantimonate, tris(4-methoxyphenyl)sulfonium hexafluorophosphate, diphenyl-4-thiophenoxyphenylsulfonium hexafluoroantimonate, diphenyl-4-thiophenoxyphenylsulfonium hexafluorophosphate, 4,4'-bis(diphenylsulfonio)phenylsulfide bishexafluoroantimonate, 4,4'-bis(diphenylsulfonio)phenylsulfide bishexafluorophosphate, 4,4'-bis[di(β-hydroxyethoxy)phenylsulfonio]phenylsulfide bishexafluoroantimonate, 4,4'-bis[di(β-hydroxyethoxy)phenylsulfonio]phenylsulfide bishexafluorophosphate, 4-[4'-(benzoyl)phenylthio]phenyl-di(4-fluorophenyl)sulfonium hexafluoroantimonate and 4-[4'-(benzoyl)phenylthio]phenyl-di(4-fluorophenyl)sulfonium hexafluorophosphate.

Commercial products may be used as these onium salts. Illustrative examples include San-Aid SI-60, SI-80, SI-100, SI-60L, SI-80L, SI-100L, SI-L145, SI-L150, SI-L160, SI-L110 and SI-L147 (all available from Sanshin Chemical Industry Co., Ltd.); UVI-6950, UVI-6970, UVI-6974, UVI-6990 and UVI-6992 (all available from Union Carbide); CPI-100P, CPI-100A, CPI-200K and CPI-200S (all available from San-Apro Ltd.); Adeka Optomer SP-150, SP-151, SP-170 and SP-171 (all available from Adeka Corporation); Irgacure 261 (BASF); CI-2481, CI-2624, CI-2639 and CI-2064 (Nippon Soda Co., Ltd.); CD-1010, CD-1011 and CD-1012 (Sartomer Company); DS-100, DS-101, DAM-101, DAM-102, DAM-105, DAM-201, DSM-301, NAI-100, NAI-101, NAI-105, NAI-106, SI-100, SI-101, SI-105, SI-106, PI-105, NDI-105, BENZOIN TOSYLATE, MBZ-101, MBZ-301, PYR-100, PYR-200, DNB-101, NB-101, NB-201, BBI-101, BBI-102, BBI-103 and BBI-109 (all from Midori Kagaku Co., Ltd.); PCI-061T, PCI-062T, PCI-020T and PCI-022T (all from Nippon Kayaku Co., Ltd.); and IBPF and IBCF (Sanwa Chemical Co., Ltd.).

The photobase generator used may be one selected from among known photobase generators. For example, use may be made of Co-ammine complex-type, oxime carboxylic acid ester-type, carbamic acid ester-type and quaternary ammonium salt-type photobase generators.

Illustrative examples include 2-nitrobenzylcyclohexyl carbamate, triphenylmethanol, O-carbamoylhydroxylamide, O-carbamoyloxime, [[(2,6-dinitrobenzyl)oxy]carbonyl]cyclohexylamine, bis[[(2-nitrobenzyl)oxy]carbonyl]hexane-1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl) pyrrolidine, hexaamminecobalt(III) tris(triphenylmethylborate), 2-benzyl-2-dimethylamino-1-(4-morpholinophenyl)butanone, 2,6-dimethyl-3,5-diacetyl-4-(2'-nitrophenyl)-1,4-dihydropyridine and 2,6-dimethyl-3,5-diacetyl-4-(2',4'-dinitrophenyl)-1,4-dihydropyridine.

A commercial product may be used as the photobase generator. Illustrative examples include TPS-OH, NBC-101 and ANC-101 (all available under these product names from Midori Kagaku Co., Ltd.).

In cases where a photoacid or photobase generator is used, the amount thereof is preferably in the range of 0.1 to 15 parts by weight, and more preferably 1 to 10 parts by weight, per 100 parts by weight of the polyepoxy compound.

Also, from 1 to 100 parts by weight of an epoxy resin curing agent may be optionally included per 100 parts by weight of the polyepoxy compound.

In cases where a poly(meth)acrylic compound is used, a photoradical initiator may also be used.

A known photoradical initiator may be suitably selected and used for this purpose. Exemplary photoradical initiators include acetophenones, benzophenones, Michler's benzoyl benzoate, amyloxime esters, oxime esters, tetramethylthiuram monosulfide and thioxanthones.

Photocleavable photoradical initiators are especially preferred. Photocleavable photoradical initiators are listed on page 159 of *Saishin UV Kōka Gijutsu* [Recent UV Curing Technology] (publisher, K. Takausu; published by Gijutsu Joho Kyokai K K; 1991).

Examples of commercial photoradical initiators include those available from BASF under the trade names Irgacure 127, 184, 369, 379, 379EG, 651, 500, 754, 819, 903, 907, 784, 2959, CGI1700, CGI1750, CGI1850, CG24-61, OXE01 and OXE02, and the trade names Darocur 1116, 1173 and MBF; that available from BASF under the trade name Lucirin TPO; that available from UCB under the trade name Uvecryl P 36; and those available under the trade names Esacure KIP150, KIP65LT, KIP100F, KT37, KT55, KT046 and KIP75/B from the Fratelli Lamberti Company.

The photoradical initiator is used in the range of preferably 0.1 to 200 parts by weight, and more preferably 1 to 150 parts by weight, per 100 parts by weight of the poly(meth) acrylic compound.

Any of various types of solvents may be added to the inventive composition and used to dissolve the triazine ring-containing polymer.

Illustrative examples of the solvent include water, toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol mono ethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclopentanone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-methoxy-2-propanol, tetrahydrofuran, 1,4-dioxane, N,N-dimethylformamide, N,N-dimethylacetamide (DMAc), N-methylpyrrolidone, 1,3-dimethyl-2-imidazolidinone, dimethylsulfoxide and N-cyclohexyl-2-pyrrolidinone. These may be used singly or two or more may be used in combination.

The solids concentration in the composition is not particularly limited, provided it is in a range that does not adversely affect the storage stability, and may be suitably selected according to the target film thickness. Specifically, from the standpoint of solubility and storage stability, the solids concentration is preferably from 0.1 to 50 wt %, and more preferably from 0.1 to 40 wt %.

Ingredients other than the triazine ring-containing polymer, crosslinking agent and solvent may also be included in the inventive composition, provided that doing so does not detract from the advantageous effects of the invention. Examples of such other ingredients include additives such as leveling agents, surfactants, silane coupling agents, polymerization inhibitors, antioxidants, corrosion inhibitors, mold release agents, plasticizers, defoamers, thickeners, dispersants, antistatic agents, sedimentation inhibitors, pigments, dyes, ultraviolet absorbers, light stabilizers and inorganic fine particles.

Illustrative examples of surfactants include the following nonionic surfactants: polyoxyethylene alkyl ethers such as polyoxyethylene lauryl ether, polyoxyethylene stearyl ether, polyoxyethylene cetyl ether and polyoxyethylene oleyl ether; polyoxyethylene alkyl aryl ethers such as polyoxyethylene octyl phenyl ether and polyoxyethylene nonyl phenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; and additionally include fluorosurfactants such as those available under the trade names Eftop EF301, EF303 and EF352 (from Mitsubishi Materials Electronic Chemicals Co., Ltd. (formerly Jemco Inc.)), Megafac F171, F173, R-08, R-30, R-40, R-41, F-114, F-410, F-430, F-444, F-477, F-552, F-553, F-554, F-555, F-556, F-557, F-558, F-559, F-561, F-562, RS-75, RS-72-K RS-76-E, RS-76NS and RS-77 (DIC Corporation), Fluorad FC430 and FC431 (Sumitomo 3M, Ltd.), AsahiGuard AG710 and Surflon S-382, SC101, SC102, SC103, SC104, SC105 and SC106 (Asahi Glass Co., Ltd.); and also the organosiloxane polymers KP341 (Shin-Etsu Chemical Co., Ltd.) and BYK-302, BYK-307, BYK-322, BYK-323, BYK-330, BYK-333, BYK-370, BYK-375 and BYK-378 (BYK-Chemie Japan KK).

These surfactants may be used singly, or two or more may be used in combination. The amount of surfactant used per 100 parts by weight of the triazine ring-containing polymer is preferably from 0.0001 to 5 parts by weight, more preferably from 0.001 to 1 part by weight, and even more preferably from 0.01 to 0.5 part by weight.

Exemplary inorganic fine particles include oxides, sulfides and nitrides of one, two or more metals selected from the group consisting of beryllium, aluminum, silicon, titanium, vanadium, iron, copper, zinc, yttrium, zirconium, niobium, molybdenum, indium, tin, antimony, tantalum, tungsten, lead, bismuth and cerium. Oxides of these metals are especially preferred. The inorganic fine particles may be of a single type used alone, or two or more types may be used in combination.

Illustrative examples of metal oxides include $Al_2O_3$, ZnO, $TiO_2$, $ZrO_2$, $Fe_2O_3$, $Sb_2O_5$, BeO, ZnO, $SnO_2$, $CeO_2$, $SiO_2$ and $WO_3$.

It is also effective to use a plurality of metal oxides as a mixed oxide. Mixed oxides refer to two or more inorganic oxides that have been mixed together at the fine particle production stage. Illustrative examples include mixed oxides of $TiO_2$ and $ZrO_2$, mixed oxides of $TiO_2$ and $ZrO_2$ and $SnO_2$, and mixed oxides of $ZrO_2$ and $SnO_2$.

In addition, compounds of the above metals may be used. Examples of such compounds include $ZnSb_2O_6$, $BaTiO_3$, $SrTiO_3$ and $SrSnO_3$. Such compounds may be used singly, two or more may be used in admixture, or such compounds may be used in admixture with the above oxides.

The other ingredients mentioned above may be added in any step during preparation of the inventive composition.

The film-forming composition of the invention may be rendered into the desired cured film by applying the composition onto a substrate, then optionally heating to evaporate off the solvent, followed by heating or light irradiation.

Any suitable method may be used for applying the composition, such as spin coating, dipping, flow coating, inkjet printing, jet dispensing, spraying, bar coating, gravure coating, slit coating, roll coating, transfer printing, brush coating, blade coating and air knife coating.

Illustrative examples of the substrate include substrates made of silicon, indium tin oxide (ITO)-coated glass, indium zinc oxide (IZO)-coated glass, polyethylene terephthalate (PET), plastic, glass, quartz or ceramic. Use can also be made of a flexible substrate having pliability.

The bake temperature for evaporating off the solvent is not particularly limited. The bake may be carried out at, for example, from 110 to 400° C.

The bake process is not particularly limited. For example, evaporation may be effected using a hot plate or an oven, such evaporation being carried out under a suitable atmosphere, such as in open air, in nitrogen or another inert gas, or in a vacuum.

With regard to the bake temperature and time, conditions which are compatible with the processing steps for the target electronic device should be selected. Bake conditions should be selected in such a way that the physical values of the resulting film conform to the required characteristics of the electronic device.

The conditions in cases where light irradiation is carried out are also not particularly limited. For example, an irradiation energy and time which are suitable for the triazine ring-containing polymer and crosslinking agent used may be employed.

In the production of a cured film by irradiating the composition with light, it is also possible to form a fine pattern by light irradiation through a mask, followed by development with a developing solution.

In this case, development following light exposure may be carried out by immersing the light-exposed resin in, for example, an organic solvent-based developing solution or an aqueous developing solution.

Examples of organic solvent-based developing solutions include those prepared with PGME, PGMEA, a mixed solvent of PGME and PGMEA, NMP, γ-butyrolactone, or DMSO. Examples of aqueous developing solutions include alkaline aqueous solutions of, e.g., sodium carbonate, potassium carbonate, sodium hydroxide, potassium hydroxide or tetramethylammonium hydroxide.

For preparation of a negative-working patterning composition, an oxirane ring-containing compound and a photocuring catalyst may additionally be included in the above composition.

The oxirane ring-containing compound is exemplified by those having one or more, and preferably two or more, oxirane rings on the molecule. Illustrative examples include glycidyl ether-type epoxy resins, glycidyl ester-type epoxy resins, alicyclic epoxy resins, epoxy-modified polybutadiene resins and oxetane compounds. These may be used singly, or two or more may be used in combination.

The oxirane ring-containing compound content, although not particularly limited, may be set to from about 10 to about 400 parts by weight per 100 parts by weight of the triazine ring-containing polymer.

Photocuring catalysts are exemplified by photocation generators. Illustrative examples of photocation generators include triarylsulfonium salts such as triphenylsulfonium hex afluorophosphate and triphenylsulfonium hexafluoroantimonate; triarylselenium salts; and diaryliodonium salts such as diphenyliodonium hexafluorophosphate and diphenyliodonium hexafluoroantimonate. These may be used singly, or two or more may be used in combination.

The photocuring catalyst content, although not particularly limited, may be set to from about 0.1 to about 100 parts by weight per 100 parts by weight of the triazine ring-containing polymer.

The method of preparing the negative-working patterning composition is not particularly limited; preparation may be carried out by adding the ingredients in any order. Also, the above-mentioned solvent may be used at this time.

This composition, after being applied onto a substrate by the above-described technique, may be cured by irradiation with, e.g., ultraviolet light at a dose of 1 to 4,000 mJ/cm$^2$. Light irradiation may be carried out using any of various known means, such as a high-pressure mercury vapor lamp, metal halide lamp, xenon lamp, LEDs or laser light.

Where necessary, the composition may be heated at about 110 to 180° C. before and after light exposure.

Development following light exposure may be carried out by immersing the exposed resin in the above-described organic solvent-based developing solution or aqueous developing solution.

For preparation as a positive-working patterning composition, an azide compound may additionally be included in the above composition.

The azide compound is preferably a compound having at least one, and more preferably at least two, 1,2-naphthoquinonediazide groups. Illustrative examples include 1,2-naphthoquinonediazidosulfonic acid derivatives such as the ester of 2,3,4-trihydroxybenzophenone and 1,2-naphthquinone-2-diazido-5-sulfonic acid.

The azide compound content, although not particularly limited, may be set to about 4 to 60 parts by weight per 100 parts by weight of the triazine ring-containing polymer.

The method of preparing the positive-working patterning composition is not particularly limited; preparation may be carried out by adding the ingredients in any order. Also, the above-mentioned solvent may be used at this time.

This composition, after being applied onto a substrate by the above-described technique, may be cured by the above-mentioned light-irradiating means involving irradiation with, e.g., ultraviolet light at a dose of 1 to 2,000 mJ/cm$^2$. Here too, where necessary, the composition may be heated at about 110 to 180° C. before and after light exposure.

Development following light exposure may be carried out by immersing the exposed resin in the above-mentioned organic solvent-based developing solution or aqueous developing solution.

Various types of additives may be optionally added to the above patterning compositions. Illustrative examples of additives include thermocation generators such as benzyl-4-hydroxyphenylmethylsulfonium hex afluoroantimonate, 1-naphthylmethyl-4-hydroxyphenylmethylsulfonium hexafluoroantimonate and 4-hydroxyphenyldimethylsulfonium methyl sulfate; photosensitizers such as 2,5-diethylthioxanthone, anthracene and 9,10-ethoxyanthracene; and the additives mentioned above in the description of the film-forming composition.

The cured films and fine patterns of the invention obtained in the above manner are able to attain a high heat resistance, high refractive index and low volume shrinkage, and therefore can be suitably utilized in the fields of electronic devices and optical materials as, for example, components in the fabrication of liquid-crystal displays, organic electroluminescent (EL) displays, touch panels, photosemiconductor (LED) devices, solid-state image sensors, organic thin-film solar cells, dye-sensitized solar cells, organic thin-film transistors (TFTs), lenses, prisms, cameras, binoculars, microscopes, semiconductor steppers and the like.

In particular, because cured films and fine patterns produced from the inventive composition have a high transparency and also have a high refractive index, the visibility of transparent conductive films made of ITO or silver nanowires can be improved and the deterioration of transparent conductive films can be inhibited.

The transparent conductive film is preferably an ITO film, an IZO film, or a transparent conductive film having electrically conductive nanostructures such as metal nanoparticles, metal nanowires or metal nanomeshes. A transparent conductive film having electrically conductive nanostructures is more preferred. The metal making up the conductive nanostructures is not particularly limited. Examples include silver, gold, copper, nickel, platinum, cobalt, iron, zinc, ruthenium, rhodium, palladium, cadmium, osmium, iridium, and alloys thereof. That is, a transparent conductive film having, for example, silver nanoparticles, silver nanowires, silver nanomeshes, gold nanoparticles, gold nanowires, gold nanomeshes, copper nanoparticles, copper nanowires or copper nanomeshes is preferred. A transparent conductive film having silver nanowires is especially preferred.

Moreover, high refractive index patterns produced from the inventive composition can be advantageously used in applications for which high refractive index patterns are desired, such as to prevent the transparent electrodes in the above touch panels and the like from being visually apparent, organic EL display light extraction applications, and black matrix applications.

EXAMPLES

Working Examples and Comparative Examples are given below to more concretely illustrate the invention, although the invention is not limited by these Examples. The instruments used in the Examples were as follows.

[$^1$H-NMR]

Instruments: Varian NMR System 400 NB (400 MHz) JEOL-ECA700 (700 MHz)

Solvent used in measurement: DMSO-d6

Reference material: Tetramethylsilane (TMS) (δ=0.0 ppm)

[GPC]

Instrument: SCL-10Avp (Shimadzu Corporation), modified for GPC

Columns: Shodex KF-804L+KF-805L

Column temperature: 60° C.

Solvent: N-methyl-2-pyrrolidone (NMP) (1% LiCl)

Detector: UV (254 nm)

Calibration curve: polystyrene standard

[Ultraviolet/Visible Spectrophotometer]

Instrument: UV-3600 (Shimadzu Corporation)

[Ellipsometer]

Instrument: VASE multiple incident angle spectroscopic ellipsometer (JA Woollam Japan)

[Thermogravimetric/Differential Thermal Analyzer (TG-DTA)]

Instrument: TG-8120 (Rigaku Corporation)

Temperature rise rate: 10° C./min

Measurement temperatures: 25° C. to 750° C.

[Electron Microscope]

S-4800 electron microscope, from JEOL Ltd.

[1] Triazine Ring-Containing Polymer Synthesis

Working Example 1-1

Synthesis of Polymeric Compound [5]

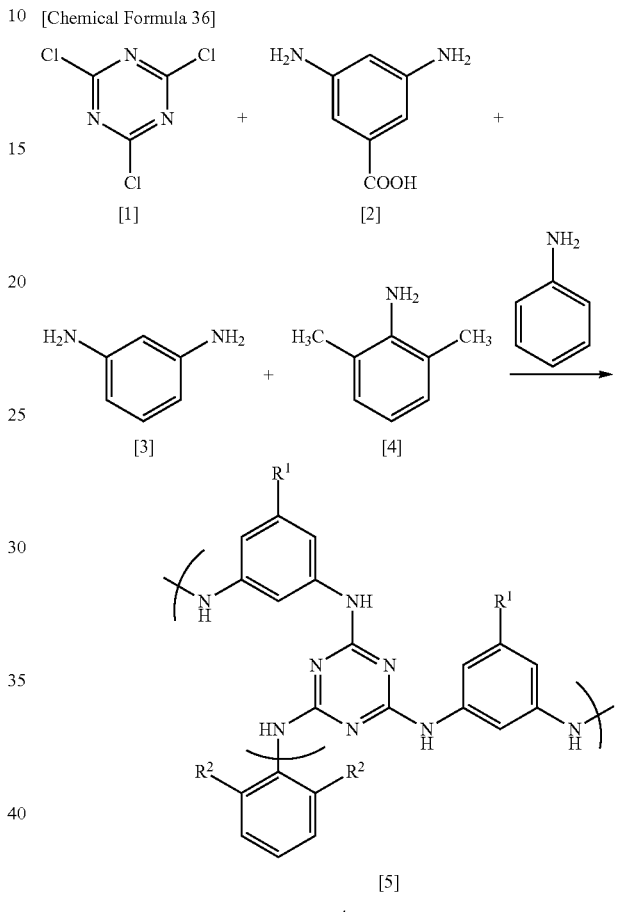

R$^1$: H or COOH
R$^2$: H or Me

Under nitrogen, 3,5-diaminobenzoic acid [2] (3.04 g, 0.02 mol), m-phenylenediamine [3] (1.08 g, 0.01 mol), 2,6-dimethylaniline [4] (1.21 g, 0.01 mol) and 81.49 g of NMP were added to a 100 mL four-neck flask and cooled to −10° C. on an acetone-dry ice bath. Next, a solution of 2,4,6-trichloro-1,3,5-triazine [1] (9.22 g, 0.05 mol; Evonik Degussa) dissolved in 69.85 g of THF was added dropwise and the flask contents were stirred for 1 hour. This reaction mixture was added dropwise over 30 minutes to a reactor consisting of a 300 mL four-neck flask to which had been added 81.49 g of NMP and which was preheated to 85° C. on an oil bath. Following such addition, the system was stirred for 2 hours, effecting polymerization.

Next, 11.31 g (0.125 mol) of aniline was added and the flask contents were stirred for 1 hour, bringing the reaction to completion. The system was cooled to room temperature in an ice bath, after which n-propylamine (6.21 g, 0.105 mol) was added dropwise and 1 hour of stirring was carried out, thereby quenching the hydrochloric acid. The reaction mixture was then reprecipitated in deionized water (1,397 g). The precipitate was filtered, re-dissolved in THF (77.6 g), and stirred for 1 hour. The supernatant was discarded, after which THF (25.87 g) was added to adjust the concentration and reprecipitation was carried out in deionized water (620.9 g). The resulting precipitate was filtered, then dried in a vacuum desiccator at 100° C. for 5 hours, giving 12.5 g of the target polymeric compound [5] (abbreviated below as "H-24X"). FIG. 1 shows the measured $^1$H-NMR spectrum for Polymeric Compound [5].

The polystyrene-equivalent weight-average molecular weight (Mw) of H-24X, as measured by GPC, was 1,200, and the polydispersity Mw/Mn was 1.32.

Upon weighing out 5.87 mg of Polymeric Compound [5] obtained in Working Example 1-1 onto a platinum pan and carrying out measurement by TG-DTA at a temperature rise rate of 15° C./min, the 5% weight loss temperature was 355.4° C.

The solutions obtained when the polymeric compound synthesized in Working Example 1-1 was dissolved to concentrations of 10 wt %, 20 wt % and 30 wt % in THF, cyclohexanone (CHN), cyclopentane (CP) and propylene glycol monomethyl ether (PGME), and when the powder was dissolved in a large amount of a 1% aqueous solution of Na$_2$CO$_3$, were visually checked for the presence of insoluble matter and evaluated according to the following criteria. The results are shown in Table 1.

Good: No insoluble matter
Fair: Slight, scattered amount of insoluble matter
NG: Sediment is present

TABLE 1

|  |  | Working Example 1-1 |
|---|---|---|
| THF | 10 wt % | good |
|  | 20 wt % | good |
|  | 30 wt % | good |
| CHN | 10 wt % | good |
|  | 20 wt % | good |
|  | 30 wt % | good |
| CPN | 10 wt % | good |
|  | 20 wt % | good |
|  | 30 wt % | good |
| PGME | 10 wt % | good |
|  | 20 wt % | good |
|  | 30 wt % | fair |
| 1% Na$_2$CO$_3$, aqueous |  | good |

As shown in Table 1, because the polymeric compound obtained in Working Example 1-1 is a polymeric compound having carboxyl group-containing arylene groups on the main chain, it has an excellent solubility in various organic solvents and also in weakly alkaline aqueous solutions.

Working Example 1-2

Synthesis of Polymeric Compound [6]

[Chemical Formula 37]

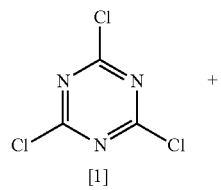

[1]

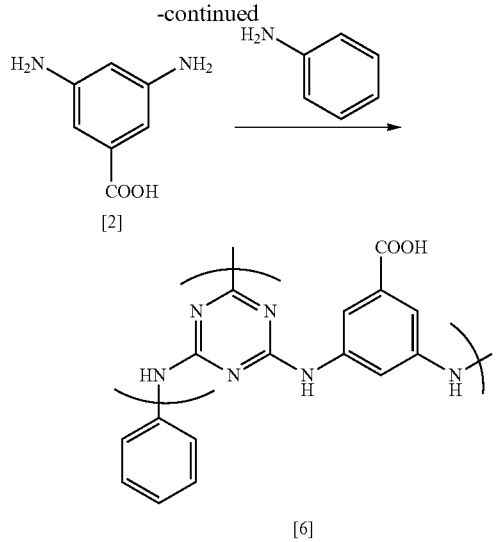

Under nitrogen, 3,5-diaminobenzoic acid [2] (18.24 g, 0.12 mol; Nippon Junryo Chemicals) was added to a 500 mL four-neck flask and dissolved in 129.28 g of N,N-dimethylacetamide (DMAc), and the flask contents were cooled to not above 0° C. Next, 2,4,6-trichloro-1,3,5-triazine [1] (18.44 g, 0.1 mol; Evonik Degussa) was added a little at a time so as to keep the temperature within the system at 0° C. or below and the flask contents were stirred for 1 hour. This solution was added dropwise to a 500 mL four-neck flask to which had been added 129.39 g of DMAc and which was preheated to 90° C. Following addition, the reaction was effected at 90° C. for 2 hours, aniline (27.9 g, 0.3 mol; Tokyo Chemical Industry Co., Ltd.) was added dropwise and the system was stirred for 3 hours. The temperature was then lowered to room temperature and 17.7 g of n-propylamine was added dropwise, stopping polymerization.

The resulting reaction mixture was added dropwise to 1,600 g of deionized water and re-precipitation was carried out. The resulting precipitate was filtered and the filtered matter was re-dispersed in 262 g of tetrahydrofuran, then re-precipitated in 1,596 g of deionized water. Next, the product obtained by filtration was dried at 120° C. for 8 hours, giving 25.5 g of the target polymeric compound [6] (referred to below as "HB-TDCOOH").

Figure 2:
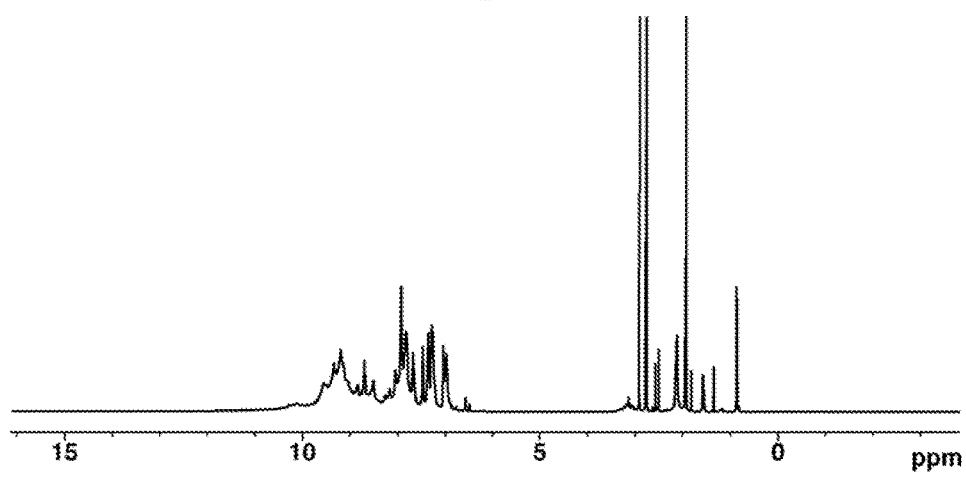
FIG. 2 shows the $^1$H-NMR spectrum for Polymeric Compound [6] obtained in Working Example 1-2.

FIG. 2 shows the measured $^1$H-NMR spectrum for Polymeric Compound [6].

Upon weighing out 5.200 mg of Polymeric Compound [6] obtained in Working Example 2-1 on a platinum pan and carrying out measurement by TG-DTA at a temperature rise rate of 15° C./min, the 5% weight loss temperature was 392° C.

[2] Film Production

Working Example 2-1

A film was obtained by dissolving Polymeric Compound [5] synthesized in Working Example 1-1 in PGME to a concentration of 10 wt %, using a spin coater to spin coat the resulting solution onto a glass substrate, and carrying out a 3-minute bake on a 120° C. hot plate.

Working Example 2-2

A 20 wt % polymer solution was prepared under nitrogen within a sample vial by dissolving 4.00 g of Polymeric Compound [6] obtained in Working Example 2-1 in 16.00 g of a mixed solvent of PGME/n-propylamine/deionized water (72.25/12.25/15, by weight).

A film was obtained by dissolving this solution in PGME to a concentration of 10 wt %, using a spin coater to spin coat the resulting solution onto a glass substrate to a target film thickness of 700 nm and carrying out a 1-minute bake on a 100° C. hot plate.

The refractive indices and film thicknesses of the films produced in Working Examples 2-1 and 2-2 are shown in Table 2.

TABLE 2

| | Working Example 2-1 | Working Example 2-2 |
|---|---|---|
| Refractive index (at 550 nm) | 1.756 | 1.752 |
| Film thickness (nm) | 334 | 764 |

As shown in Table 2, the thin films produced from the polymeric compound synthesized in Working Example 1-1 had refractive indices higher than 1.75.

[3] Preparation of Crosslinking Agent-Containing Composition, and Patterning and Cured Film Production Working Example 3-1

A patterning composition (6.36 g) having a solids content of 20 wt % was prepared by adding the following to 0.6 g of Polymeric Compound [5] obtained in Working Example 1-1: 0.3 g of the polyacrylate DN-0075 (Nippon Kayaku Co., Ltd.), 0.3 g of the polyacrylate A-GLY-20E (Shin-Nakamura Chemical Co., Ltd.), 0.06 g of the photoradical initiator Irgacure OXE01 (BASF) and 5.04 g of PGME.

This composition was filtered with a 0.45 μm filter and coated onto a glass substrate using a spin coater, following which it was baked on a hot plate at 120° C. for 60 seconds, thereby forming a film. The film was irradiated through a photomask with ultraviolet light in a dose at 365 nm of 100 mJ/cm² using a UV aligner (MA6, from Karl Suss). Next, the film was developed by 60 seconds of immersion in a 0.04 wt % aqueous solution of potassium hydroxide at 23° C., and then rinsed with ultrapure running water. Following development, a striped pattern with line/space dimensions of 60 μm/500 μm resolved without residues. Visual examination under a sodium lamp was carried out, whereupon foreign matter was not observed in the cured film that formed on the glass substrate. In addition, on carrying out electron microscopic examination, foreign matter was not observed on the cured film.

The invention claimed is:
1. A triazine ring-containing hyperbranched polymer comprising a recurring unit structure of formula (1) below

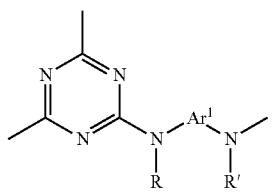

(1)

wherein
R and R' are each independently a hydrogen atom, an alkyl group, an alkoxy group, an aryl group or an aralkyl group; and
$Ar^1$ is at least one moiety selected from the group consisting of moieties of formulas (2) to (13)

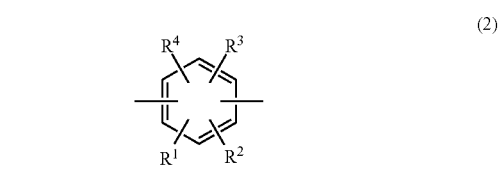

(2)

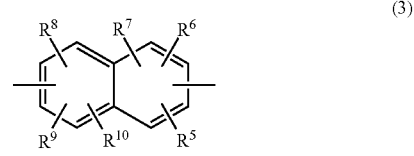

(3)

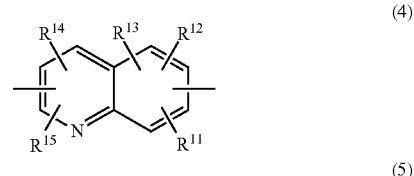

(4)

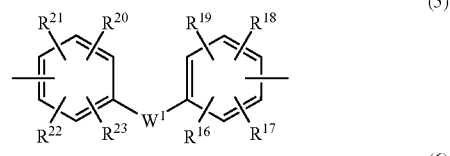

(5)

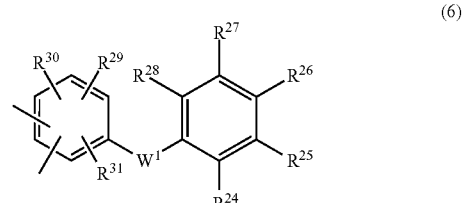

(6)

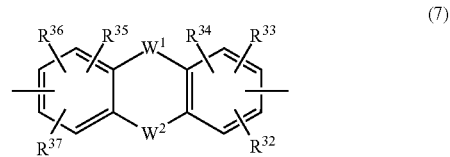

(7)

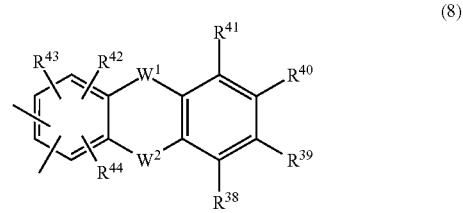

(8)

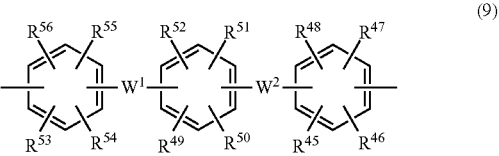

(9)

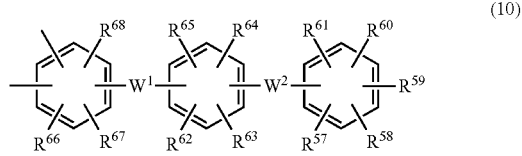

(10)

-continued

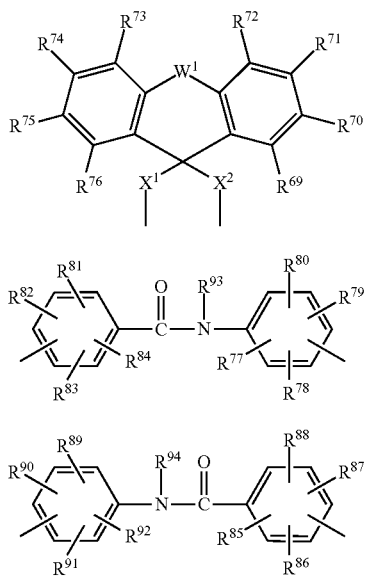

(11)

(12)

(13)

wherein R¹ to R⁹² are each independently a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure; R⁹³ and R⁹⁴ are each a hydrogen atom or an alkyl group of 1 to 10 carbon atoms which may have a branched structure; W¹ and W² are each independently a single bond, CR⁹⁵R⁹⁶, wherein R⁹⁵ and R⁹⁶ are each independently a hydrogen atom or an alkyl group of 1 to 10 carbon atoms which may have a branched structure, and R⁹⁵ and R⁹⁶ may together form a ring, C=O, O, S, SO, SO₂ or NR⁹⁷, R⁹⁷ being a hydrogen atom or an alkyl group of 1 to 10 carbon atoms which may have a branched structure; and X¹ and X² are each independently a single bond, an alkylene group of 1 to 10 carbon atoms which may have a branched structure, or a group of formula (14)

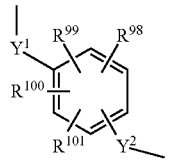

(14)

wherein R⁹⁸ to R¹⁰¹ are each independently a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure; and Y¹ and Y² are each independently a single bond or an alkylene group of 1 to 10 carbon atoms which may have a branched structure; with the proviso that formulas (2) to (13) all have at least one carboxyl group on one aromatic ring therein,
wherein the polymer has a least one triazine ring end, and at least a portion of the triazine ring ends are capped with an arylamino group having an alkyl, alkoxy, aryl, or aralkyl group at at least one ortho position to the amino group thereon.

2. The triazine ring-containing polymer of claim 1, further comprising a recurring unit structure of formula (1') below

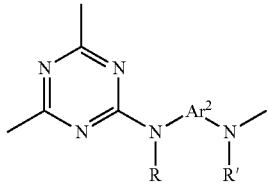

(1')

wherein
R and R' are each independently a hydrogen atom, an alkyl group, an alkoxy group, an aryl group or an aralkyl group; and
Ar² is at least one moiety selected from the group consisting of moieties of formulas (2') to (13')

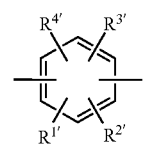

(2')

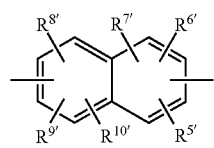

(3')

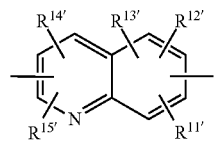

(4')

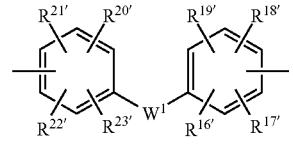

(5')

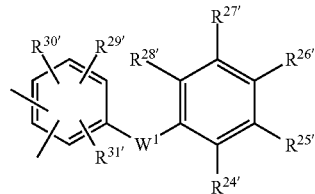

(6')

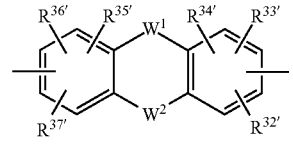

(7')

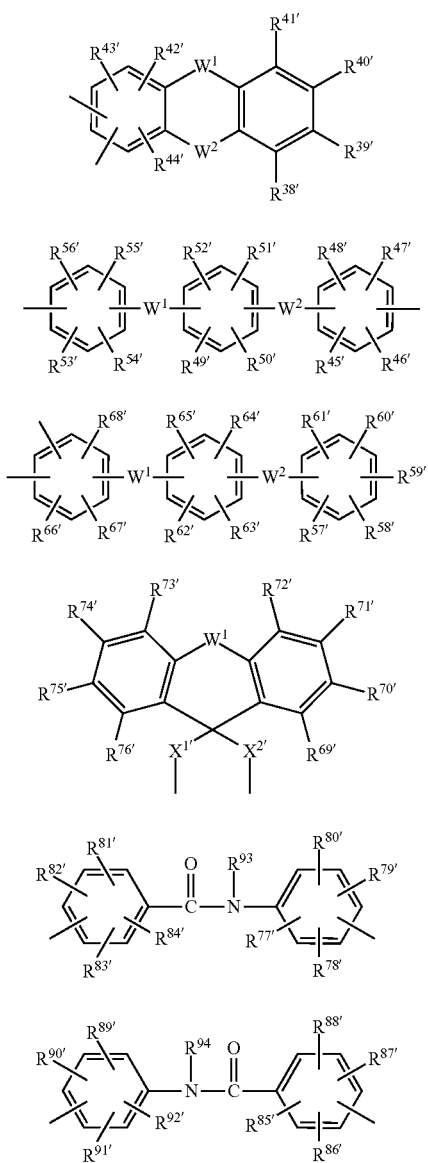

wherein $R^{1'}$ to $R^{92'}$ are each independently a hydrogen atom, a halogen atom, a sulfo group, an alkyl group of 1 to 10 carbon atoms which may have a branched structure, or an alkoxy group of 1 to 10 carbon atoms which may have a branched structure; $R^{93}$ and $R^{94}$ are each a hydrogen atom or an alkyl group of 1 to 10 carbon atoms which may have a branched structure; $W^1$ and $W^2$ are each independently a single bond, $CR^{95}R^{96}$, wherein $R^{95}$ $R^{95}$ and $R^{96}$ are each independently a hydrogen atom or an alkyl group of 1 to 10 carbon atoms which may have a branched structure, and $R^{95}$ and $R^{96}$ may together form a ring, C=O, O, S, SO, $SO_2$, or $NR^{97}$, $R^{97}$ being a hydrogen atom or an alkyl group of 1 to 10 carbon atoms which may have a branched structure; and $X^{1'}$ and $X^{2'}$ are each independently a single bond, an alkylene group of 1 to 10 carbon atoms which may have a branched structure, or a group of formula (14')

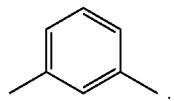

wherein $R^{98'}$ to $R^{101'}$ are each independently a hydrogen atom, a halogen atom, a sulfo group, an alkyl group of 1 to 10 carbon atoms which may have a branched structure, or an alkoxy group of 1 to 10 carbon atoms which may have a branched structure; and $Y^1$ and $Y^2$ are each independently a single bond or an alkylene group of 1 to 10 carbon atoms which may have a branched structure.

3. The triazine ring-containing polymer of claim 2, wherein $Ar^2$ has formula (17).

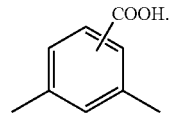

4. The triazine ring-containing polymer of claim 1, wherein $Ar^1$ has formula (15).

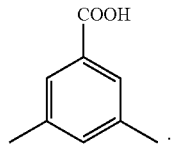

5. The triazine ring-containing polymer of claim 4, wherein $Ar^1$ has formula (16)

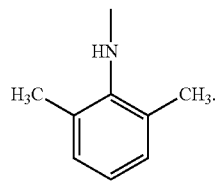

6. The triazine ring-containing polymer of claim 1, wherein the arylamino group has the alkyl, alkoxy, aryl or aralkyl group at both ortho positions to the amino group thereon.

7. The triazine ring-containing polymer of claim 6, wherein the arylamino group has formula (18).

8. A triazine polymer-containing composition comprising the triazine ring-containing polymer of claim 1 and an organic solvent.

9. The triazine polymer-containing composition of claim 8 which further comprises a crosslinking agent.

10. The triazine polymer-containing composition of claim 9, wherein the crosslinking agent is a poly(meth)acrylic compound.

11. A cured film obtained by curing the triazine polymer-containing composition of claim 9.

12. A pattern produced from the triazine polymer-containing composition of claim 9.

13. An electronic device comprising a substrate and the cured film of claim 11 formed on the substrate.

14. An optical member comprising a substrate and the cured film of claim 11 formed on the substrate.

15. An electronic device comprising a substrate and the pattern of claim 12 formed on the substrate.

* * * * *